United States Patent
Yamada

(10) Patent No.: US 7,475,377 B2
(45) Date of Patent: Jan. 6, 2009

(54) SEMICONDUCTOR DEVICE DESIGN SYSTEM AND METHOD, AND SOFTWARE PRODUCT FOR THE SAME

(75) Inventor: Kenta Yamada, Kanagawa (JP)

(73) Assignee: NEC Corporation, Tokyo (JP)

( * ) Notice: Subject to any disclaimer, the term of this patent is extended or adjusted under 35 U.S.C. 154(b) by 374 days.

(21) Appl. No.: 11/341,581

(22) Filed: Jan. 30, 2006

(65) Prior Publication Data

US 2006/0190876 A1 Aug. 24, 2006

(30) Foreign Application Priority Data

Jan. 31, 2005 (JP) .............................. 2005-024557

(51) Int. Cl.
*G06F 17/50* (2006.01)
(52) U.S. Cl. ............................... 716/12; 716/4; 716/11; 716/18
(58) Field of Classification Search ..................... 716/2, 716/4, 11, 12
See application file for complete search history.

(56) References Cited

U.S. PATENT DOCUMENTS

2002/0077798 A1   6/2002   Inoue et al.
2006/0048081 A1*  3/2006   Kiel et al. ...................... 716/4

FOREIGN PATENT DOCUMENTS

JP         2001-265826 A      9/2001

* cited by examiner

*Primary Examiner*—Thuan Do
(74) *Attorney, Agent, or Firm*—Foley & Lardner LLP

(57) ABSTRACT

A software product including codes for the method of determining parasitic resistance and capacitance from a layout of an LSI is executed by a computer. The method is achieved by providing a plurality of patterns of a wiring structure which contains a target interconnection; and by producing a library configured to store parameters indicating the parasitic resistance and the parasitic capacitance in relation to the target interconnection to each of the plurality of patterns. The producing is achieved by calculating the parameters to a plurality of conditions corresponding to deviation in manufacture of the wiring structure for each of the plurality of patterns.

19 Claims, 21 Drawing Sheets

1: SEMICONDUCTOR DEVICE DESIGNING SYSTEM

NETLIST 12

NETLIST WITH PARASITIC RC 14

Fig. 11

| CORNER CONDITION | WIRING WIDTH w | WIRING THICKNESS T | INTERLAYER INSULATING FILM THICKNESS | RELATIVE DIELECTRIC CONSTANT | VIA CONTACT RESISTANCE |
|---|---|---|---|---|---|
| FIRST CONDITION (Cmax, Rmin) | $\alpha_W 1 \cdot \sigma_W$ | $\alpha_T 1 \cdot \sigma_T$ | $-3\sigma$ | $+3\sigma$ | $+3\sigma$ |
| SECOND CONDITION (Cmin, Rmax) | $\alpha_W 2 \cdot \sigma_W$ | $\alpha_T 2 \cdot \sigma_T$ | $-3\sigma$ | $+3\sigma$ | $+3\sigma$ |
| THIRD CONDITION (Cmax', Rmin') | $\alpha_W 3 \cdot \sigma_W$ | $\alpha_T 3 \cdot \sigma_T$ | $+3\sigma$ | $-3\sigma$ | $-3\sigma$ |
| FOURTH CONDITION (Cmin', Rmax') | $\alpha_W 4 \cdot \sigma_W$ | $\alpha_T 4 \cdot \sigma_T$ | $+3\sigma$ | $-3\sigma$ | $-3\sigma$ |

Fig. 13

<u>11 ; RC LIBRARY</u>

| PATTERN | | PARASITIC CAPACITANCE PARAMETER | PARASITIC RESISTANCE PARAMETER |
|---|---|---|---|
| 1 | ·Center<br>·max<br>·min<br>·max'<br>·min' | C1<br>$\beta_C 1-1$<br>$\beta_C 1-2$<br>$\beta_C 1-3$<br>$\beta_C 1-4$ | R1<br>$\beta_R 1-1$<br>$\beta_R 1-2$<br>$\beta_R 1-3$<br>$\beta_R 1-4$ |
| 2 | ·Center<br>·max<br>·min<br>·max'<br>·min' | C2<br>$\beta_C 2-1$<br>$\beta_C 2-2$<br>$\beta_C 2-3$<br>$\beta_C 2-4$ | R2<br>$\beta_R 2-1$<br>$\beta_R 2-2$<br>$\beta_R 2-3$<br>$\beta_R 2-4$ |
| 3 | ·Center<br>·max<br>·min<br>·max'<br>·min' | C3<br>$\beta_C 3-1$<br>$\beta_C 3-2$<br>$\beta_C 3-3$<br>$\beta_C 3-4$ | R3<br>$\beta_R 3-1$<br>$\beta_R 3-2$<br>$\beta_R 3-3$<br>$\beta_R 3-4$ |
| ⋮ | ⋮ | ⋮ | ⋮ |

SEMICONDUCTOR DEVICE DESIGN SYSTEM AND METHOD, AND SOFTWARE PRODUCT FOR THE SAME

BACKGROUND OF THE INVENTION

1. Field of the Invention

The present invention relates to a technique to design a semiconductor device, and in particular, relates to a technique to perform an LPE (Layout Parameter Extraction) process for a layout of a semiconductor device.

2. Description of the Related Art

In designing a semiconductor device by using a computer (CAD system), layout design is carried out based on a netlist (information showing connection relationship between logic elements) after logic design is carried out. After a layout is determined, various types of verification processes are conducted to check whether the layout satisfies a design rule, or whether a device having the layout properly operates, and so on. An LPE (Layout Parameter Extraction) process is known as one process carried out in the verification process.

In the LPE process, extraction of a parasitic resistance and a parasitic capacitance (referred to as "parasitic RC" hereinafter) relevant to an interconnection in the obtained layout is carried out. Such a parasitic RC is a parameter that can be determined only after the layout is determined, and is not included in the netlist. Therefore, an extracted parasitic RC is added to the netlist, and the netlist containing the parasitic RC (referred to as "netlist with parasitic RC" hereinafter) is generated. That is to say, a tool for carrying out the LPE process inputs a netlist and a layout data, and outputs a netlist with parasitic RC.

After that, a delay verifying process and a timing verifying process are carried out for a device on the design by using the obtained netlist with parasitic RC. When the result of the verifying process indicates a "fail" state, the above layout design process is carried out again. Then, the LPE process and the verifying process are again carried out. The above processes are repeated until the layout "passes" the verifying process. If the result of the verifying process indicates a "passed" state, a final layout data is determined.

Japanese Laid Open Patent Application (JP-P2001-265826A) discloses a technique related to the LPE process. In a circuit simulation device disclosed in Japanese Laid Open Patent Application (JP-P2001-265826A), layout information of an integrated circuit is stored in a first storage section. Also, interconnection variations information is stored in a second storage section. Process information showing a manufacturing process of an integrated circuit is stored in a third storage section. An interconnection resistance and capacitance extracting section extracts interconnection resistance and capacitance in which variation are taken into consideration based on the layout information, the interconnection variations information, and the process information, and generates a netlist that includes the extracted interconnection resistance and interconnection capacitance. A simulation section inputs the generated netlist, and conducts a delay analysis of the integrated circuit in consideration of the interconnection variations.

As stated above, the LPE process is an important process requiring high accuracy to determine whether or not a designed semiconductor device properly operates. Here, in an actual manufacturing process of a semiconductor device, a structure of an interconnection and so on may not be manufactured as precisely as is intended. In other words, an interconnection layer width, an interconnection layer thickness, an interlayer insulating film thickness, and so on may possibly indicate variations from desired values. Such a variation is referred to as a "process variation" hereinafter. The process variation affect a delay in a circuit. Since the process variation may be caused, it is possible that an actual product does not operate properly, even if a designed layout passes an operation verifying process of the computer.

In the LPE process, therefore, it is desirable to extract the parasitic RC in consideration of the process variation. It is also desirable to conduct a verifying process for a plurality of netlists with parasitic RC in which the process variation is taken into consideration. Consequently, a layout data is produced that can cope with some extent of the process variation. If a product is manufactured based on the layout data, a probability that the product is defective is reduced even if the process variation is generated.

However, when the process variation is considered, time for carrying out the LPE process and the delay verifying process is greatly increased, as compared with a case where the process variation is not considered. As stated above, the process variation include variations of a plurality of parameters such as the interconnection layer width and the interlayer insulating film thickness, and the number of combinations of the variations is huge. It is virtually impossible to extract the parasitic RC and carry out the delay verifying process for all the combinations. The above conventional example (Japanese Laid Open Patent Application (JP-P2001-265826A)) gives suggestion of the LPE process and the verifying process taking the process variation into consideration. However, the conventional example does not describe a specific method of reducing the time for the LPE process and the verifying process. A technique is demanded that can reduce the time for semiconductor device design while considering the process variation.

SUMMARY OF THE INVENTION

An aspect of the present invention relates to a computer-readable software product including codes, executed by a computer, for a method of determining parasitic resistance and capacitance from a layout of an LSI. In this case, the method is achieved by providing a plurality of patterns of a wiring structure which contains a target interconnection; and by producing a library configured to store parameters indicating the parasitic resistance and the parasitic capacitance in relation to the target interconnection to each of the plurality of patterns. The producing is achieved by calculating the parameters to a plurality of conditions corresponding to deviation in manufacture of the wiring structure for each of the plurality of patterns.

Here, the plurality of conditions includes a $0^{th}$ condition to a second condition, and a desired width and desired film thickness of the target interconnection are $W_0$ and $T_0$, respectively, standard deviations of a distribution of the width of the target interconnection and a distribution of the film thickness thereof are $\sigma_W$ and $\sigma_T$, respectively, and the width W and the film thickness T in actual manufacture of the target interconnection are expressed, by using coefficients $\alpha_W$ and $\alpha_T$, as $$W = W_0 + \alpha_W * \sigma_W$$

and $$T = T_0 + \alpha_T * \sigma_T.$$

In this case, the $0^{th}$ condition is a case where the width W and the film thickness T are $W_0$ and T0, respectively, the first condition is a case where a delay in the target interconnection is maximized under a condition that $\alpha_W^2+\alpha_T^2$ is constant, and the second condition is when the delay in the target interconnection is minimized under the condition that $\alpha_W^2+\alpha_T^2$ is constant.

Also, in case of the first condition, one of the parasitic resistance of and the parasitic capacitance related to the target interconnection is maximized, and the other is minimized, and in case of the second condition, the one is minimized and the other is maximized.

Also, the plurality of conditions further contains a third condition and a fourth condition, and a deviation of another factor which relates to the delay is ranged from $+\sigma_0$ to $-\sigma_0$. The first condition is the case where the delay is maximized under the condition that the deviation of the another factor is one of $+\sigma_0$ and $-\sigma_0$ and $\alpha_W^2+\alpha_T^2$ is constant, and the third condition is the case where the delay is maximized under the condition that the deviation of the another factor is the other of $+\sigma_0$ and $-\sigma_0$ and $\alpha_W^2+\alpha_T^2$ is constant. The second condition is the case where the delay is minimized under the condition that the deviation of the another factor is one of $+\sigma_0$ and $-\sigma_0$ and $\alpha_W^2+\alpha_T^2$ is constant, and the fourth condition is the case where the delay is minimized under the condition that the deviation of the another factor is the other of $+\sigma_0$ and $-\sigma_0$ and $\alpha_W^2+\alpha_T^2$ is constant.

Also, the coefficients $\alpha_W$ and $\alpha_T$ in the first condition are equal to the coefficients $\alpha_W$ and $\alpha_T$ in the third condition, and the coefficients $\alpha_W$ and $\alpha_T$ in the second condition are equal to the coefficients $\alpha_W$ and $\alpha_T$ in the fourth condition.

In this case, a center resistance value as a value of the parasitic resistance and a center capacitance value as a value of the parasitic capacitance are stored in a library as the parameter to the 0th condition. A ratio $\beta_R$ of the parasitic resistance to the center resistance and a ratio $\beta_C$ of the parasitic capacitance to the center capacitance value are stored in the library as the parameter to each of the first to fourth conditions.

Also, the method may be achieved by further reading a netlist of the LSI; reading a layout data indicating the layout of the LSI; calculating the parasitic resistance and the parasitic capacitance in each of the plurality of conditions to each of the interconnections contained in the layout by referring to the parameters stored in the library; and generating a netlist with parasitic RC by adding the calculated parasitic resistance and the calculated parasitic capacitance to the netlist.

Also, the method may be achieved by further reading a netlist of the LSI; reading a layout data indicating the layout of the LSI; calculating the parasitic resistance and the parasitic capacitance in each of the plurality of conditions to each of the interconnections contained in the layout by referring to the center resistance value, the center capacitance value, and the ratios $\beta_R$ and $\beta_C$ stored in the library; and generating a netlist with parasitic RC by adding the calculated parasitic resistance and the calculated parasitic capacitance to the netlist.

In this case, the calculating may be achieved by calculating the parasitic resistance and the parasitic capacitance in each of the first to fourth conditions by multiplying the ratios $\beta_R$ and $\beta_C$ by the center resistance value and the center capacitance value, respectively.

Also, the calculating may be achieved by generating correction ratios $\beta_R'$ and $\beta_C'$ by correcting the ratios $\beta_R$ and $\beta_C$ based on a configuration of a node; and calculating the parasitic resistance and the parasitic capacitance in each of the first to fourth conditions by multiplying the correction ratios $\beta_R'$ and $\beta_C'$ by the center resistance value and the center capacitance value, respectively.

In this case, when the node comprises a group of interconnections in each of N interconnection layers (N is a natural number), a summation of lengths of the interconnections in the group is Li (i is an integer equal to or more than 1 and equal to or smaller than N), and the ratio $\beta_C$ and the correction ratio $\beta_C'$ are the following equation:

$$\beta_C'=1+(\beta_C-1)\gamma_C$$

a parameter $\gamma_C$ satisfies the following equation:

$$\gamma_C = \sqrt{\sum_{i}^{N} L_i^2} \Big/ \sum_{i}^{N} L_i$$

Also, when the interconnection groups are connected in series in the node, and the ratio $\beta_R$ and the correction ratio $\beta_R'$ are the following equation:

$$\beta_R'=1+(\beta_R-1)\gamma_R$$

the parameter $\gamma_R$ satisfies the following equation:

$$\gamma_R = \sqrt{\sum_{i}^{N} L_i^2} \Big/ \sum_{i}^{N} L_i$$

Also, when the interconnection groups is branched in the node, a sub interconnection group in n interconnection layer (n is an integer equal to or more than 1 and equal to or smaller than N) is connected in series to one interconnection in the interconnection group, a summation of lengths of the interconnections in the sub interconnection group is Lj (j is an integer equal to or more than 1 and equal to or smaller than n), the ratio $\beta_R$ and the correction ratio $\beta_R'$ to the one interconnection are the following equation:

$$\beta_R'1+(\beta_R-1)\gamma_R$$

the parameter $\gamma_R$ satisfies the following equation:

$$\gamma_R = \sqrt{\sum_{j}^{n} L_j^2} \Big/ \sum_{j}^{n} L_j$$

In this case, when a plurality of the correction ratios $\beta_R'$ are calculated to the one interconnection, the largest one of the plurality of correction ratios $\beta_R'$ is adopted.

Also, the largest one of a plurality of the correction ratios $\beta_C'$ is adopted as a coupling capacitance between the nodes.

Another aspect of the present invention relates to a computer-readable software product includes codes, executed by a computer, for a method of determining parasitic resistance and capacitance from a layout of an LSI, by referring a library, wherein a wiring structure which contains a target interconnection is a pattern, and the library stores parameters indicating the parasitic resistance and the parasitic capacitance in relation to the target interconnection to a plurality of conditions for variation in manufacture of the wiring structure with respect to each of a plurality of the patterns. The method is achieved by reading a netlist of the LSI; by reading a layout data indicating the layout of the LSI; by calculating the parasitic resistance and the parasitic capacitance in each of the plurality of conditions to each of the interconnections contained in the layout by referring to the parameters stored in the library; and by generating a netlist with parasitic RC by adding the calculated parasitic resistance and the calculated parasitic capacitance to the netlist.

Here, a desired width and desired film thickness of the target interconnection are $W_0$ and $T_0$, respectively, standard deviations of a distribution of the width of the target interconnection and a distribution of the film thickness thereof are $\sigma_W$ and $\sigma_T$, respectively, and the width W and the film thickness T in actual manufacture of the target interconnection are expressed, by using coefficients $\alpha_W$ and $\alpha_T$, as $$W = W_0 + \alpha_W * \sigma_W$$

and $$T = T_0 + \alpha_T * \sigma_T.$$

The plurality of conditions comprises a $0^{th}$ condition to a second condition, and the $0^{th}$ condition is a case where the width W and the film thickness T are $W_0$ and T0, respectively. The first condition is a case where a delay in the target interconnection is maximized under a condition that $\alpha_W^2 + \alpha_T^2$ is constant, and the second condition is when the delay in the target interconnection is minimized under the condition that $\alpha_W^2 + \alpha_T^2$ is constant.

Also, the plurality of conditions further contains a third condition and a fourth condition, and a deviation of another factor which relates to the delay is ranged from $+\sigma_0$ to $-\sigma_0$. The first condition is the case where the delay is maximized under the condition that the deviation of the another factor is one of $+\sigma_0$ and $-\sigma_0$ and $\alpha_W^2 + \alpha_T^2$ is constant, and the third condition is the case where the delay is maximized under the condition that the deviation of the another factor is the other of $+\sigma_0$ and $-\sigma_0$ and $\alpha_W^2 + \alpha_T^2$ is constant. The second condition is the case where the delay is minimized under the condition that the deviation of the another factor is one of $+\sigma_0$ and $-\sigma_0$ and $\alpha_W^2 + \alpha_T^2$ is constant, and the fourth condition is the case where the delay is minimized under the condition that the deviation of the another factor is the other of $+\sigma_0$ and $-\sigma_0$ and $\alpha_W^2 + \alpha_T^2$ is constant.

Also, a center resistance value as a value of the parasitic resistance and a center capacitance value as a value of the parasitic capacitance are stored in a library as the parameter to the 0th condition, and a ratio $\beta_R$ of the parasitic resistance to the center resistance and a ratio $\beta_C$ of the parasitic capacitance to the center capacitance value are stored in the library as the parameter to each of the first to fourth conditions.

In still another aspect of the present invention, a method of manufacturing a semiconductor device which has a plurality of wiring layers, is achieved by determining design criteria, and a manufacturing condition of the semiconductor device; by carrying out layout design of the semiconductor device based on functional specification and the design criteria to produce a layout data; by estimating process variations of width and thickness of each of interconnections for every wiring layer from the layout data based on the design criteria and the manufacturing condition; by determining an interconnection delay affected by a specific condition of the process variations for every wiring layer; by repeating correction of the layout data, the estimation and the determination until the determined interconnection delay meets the function specification, to produce a final layout data; and by manufacturing the semiconductor device based on the final layout data and the manufacture condition. The determining an interconnection delay is achieved by determining a variation of the interconnection delay by using of parasitic resistance and parasitic capacitance for every wiring layer through statistical relaxation in which the process variations of width and thickness of each of interconnections are independent between the plurality of wiring layers.

BRIEF DESCRIPTION OF THE DRAWINGS

FIG. 11 is a table showing the corner conditions in the present invention;

FIG. 13 is a table showing a RC library in the present invention;

DESCRIPTION OF THE PREFERRED EMBODIMENTS

Hereinafter, a semiconductor device design system of the present invention with reference to the attached drawings.

Figure 1:
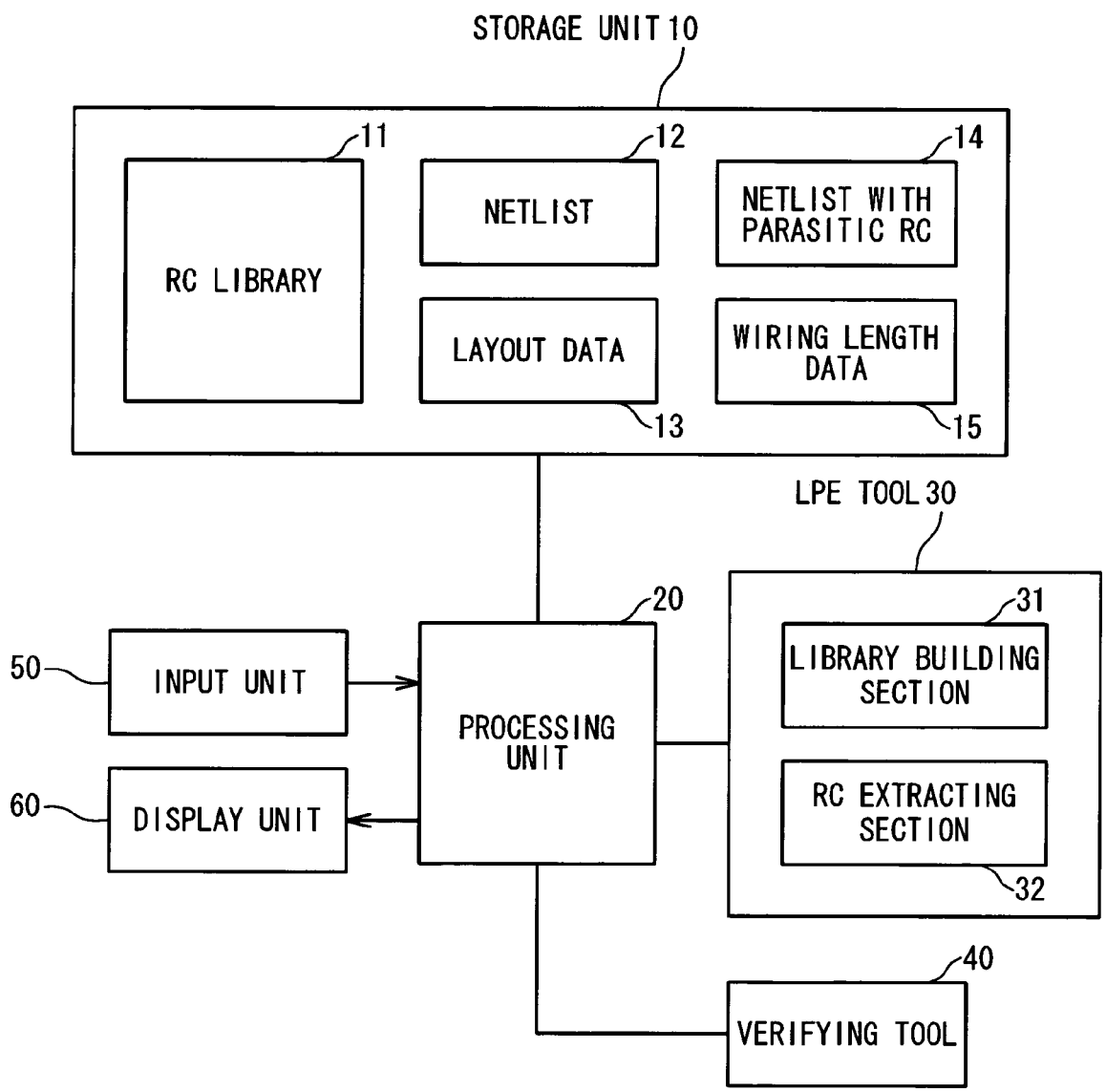
FIG. 1 is a block diagram showing a configuration of a semiconductor device design system of the present invention.

FIG. 1 is a block diagram showing a configuration of the semiconductor device design system of the present invention. The semiconductor device design system 1 is realized by a computer system (CAD: Computer Aided Design). The semiconductor device design system 1 is provided with a storage unit 10, a processing unit 20, an LPE tool 30, a verifying tool 40, an input unit 50, and a display unit 60.

The storage unit 10 is realized by a hard disk unit, for example, and configured to store an RC library 11, a netlist 12, a layout data 13, a netlist with parasitic RC 14, and an interconnection length data 15. As described later in detail, the RC library 11 is referred to at the time of a LPE process, showing a parameter (referred to as an "RC parameter" hereinafter) relevant to a parasitic capacitance and a parasitic resistance of an interconnection (referred to as a "parasitic RC" hereinafter). The netlist 12 is a data showing connection relationship between logic elements in a semiconductor device (LSI) under design. The layout data 13 shows a layout of the LSI under design. The layout data 13 is generated by an automatic layout tool (not shown), and is stored in the storage unit 10. The netlist with parasitic RC 14 is a netlist having a parasitic RC obtained by LPE process to be mentioned later. The interconnection length data 15 shows a length of each interconnection in the layout.

The processing unit 20 can access the storage unit 10. The LPE tool 30 is a computer program (software product) executed by the processing unit 20. The LPE tool 30 is provided with a library building section 31 having a function of building up the RC library 11, and an RC extracting section 32 having a function of carrying out the LPE process. The verifying tool 40 is a computer program executed by the processing unit 20, having a function of carrying out an operation verifying process (delay verifying process and timing verifying process) of the designed LSI.

As the input unit 50, a key board and a mouse are exemplified. A user (designer) can input various data and commands by using the input unit 50, while viewing information displayed on the display unit 60. By using the semiconductor device design system 1 described above, the LPE process and the operation verifying process are carried out.

Figure 2:
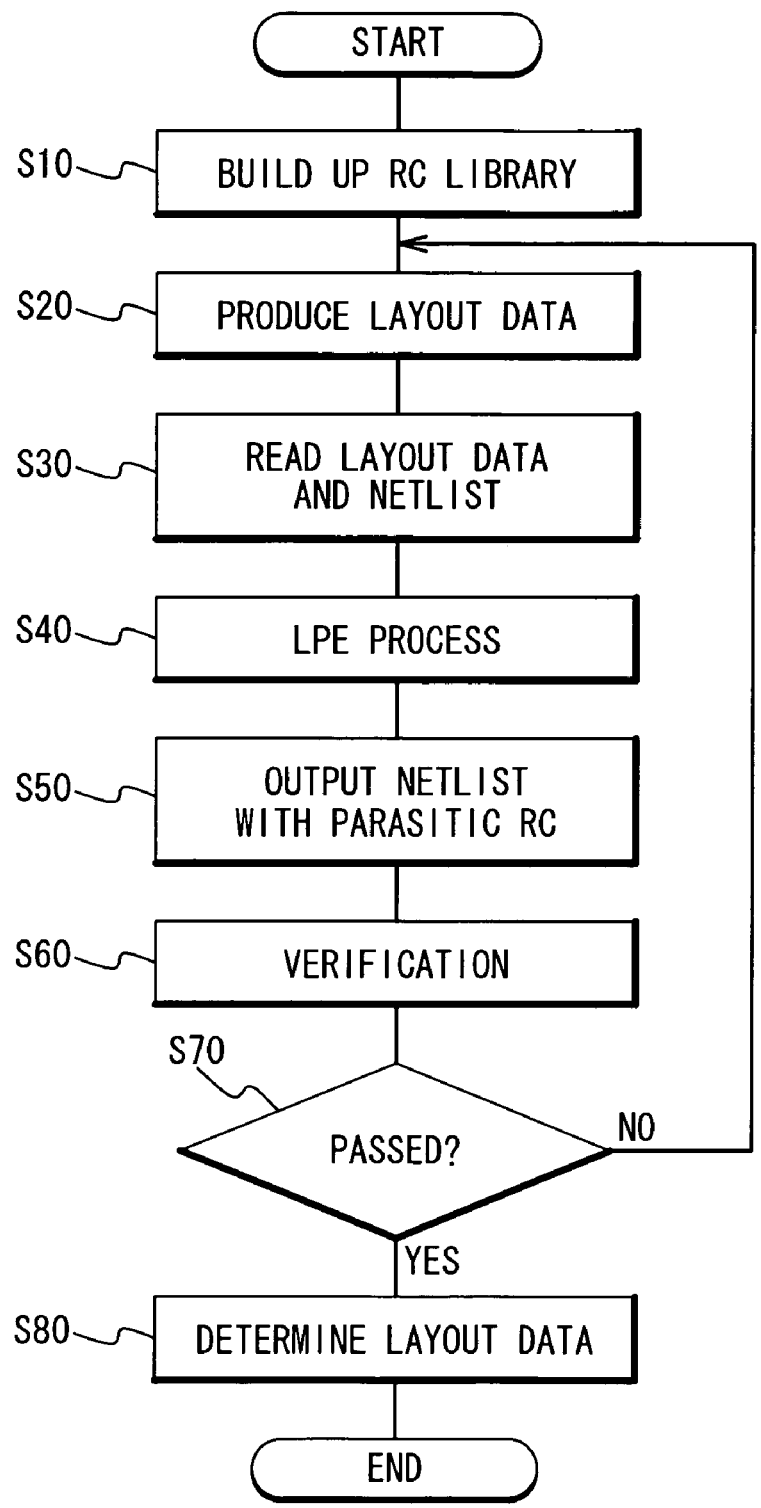
FIG. 2 is a flow chart showing an operation of the semiconductor device design system of the present invention.

FIG. 2 is a flow chart showing an operation of the semiconductor device design system 1 of the present invention. The overall flow of the present invention is briefly surveyed by referring to FIG. 2. Details of the present invention are described later.

The processing unit 20 carries out a process shown below in accordance with commands of the LPE tool 30 and the verifying tool 40.

Step S10:

First of all, the RC library 11 is built up by the library building section 31 in the LPE tool 30. The RC library 11 stores an RC parameter showing the parasitic RC of an interconnection (wiring) from which the RC parameter should be extracted (referred to as "target interconnection" hereinafter). As the RC parameter, a value of the parasitic RC itself may be stored, or a ratio of the parasitic RC to a predetermined reference value may be stored. The RC parameter is calculated for each of various interconnection layers, various shape (width and thickness) of the target interconnection, and various types of interconnection environment around the target interconnection. Such shape and peripheral interconnection environment are referred to as a "pattern (interconnection structure or wiring structure)" hereinafter.

Figure 3A:
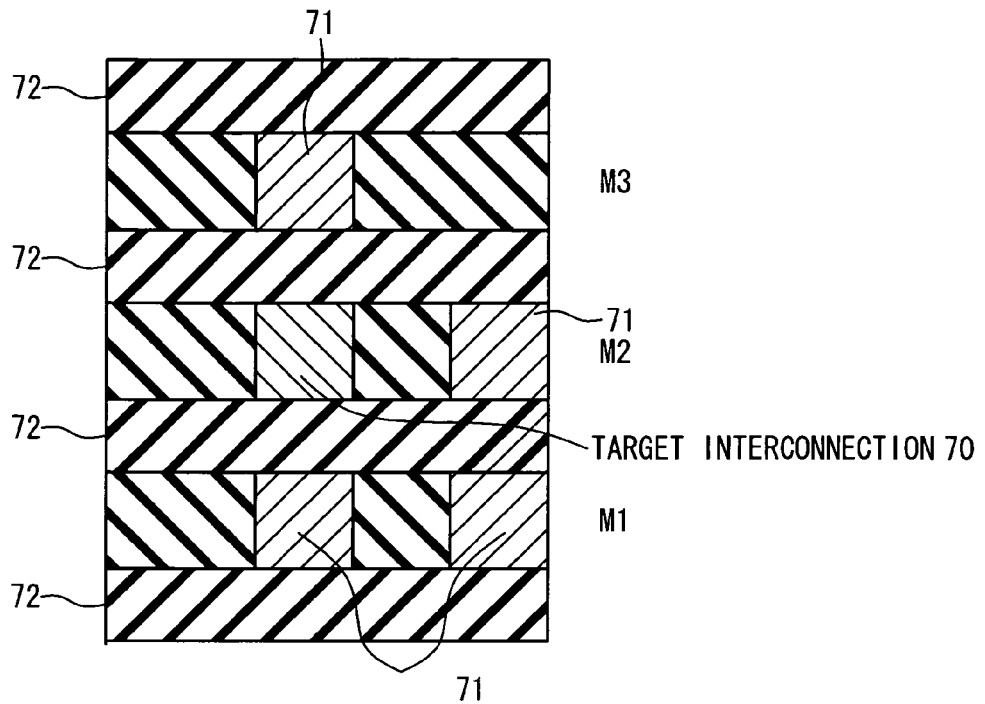
FIG. 3A is a cross-sectional view showing one pattern of an interconnection structure.
Figure 3B:
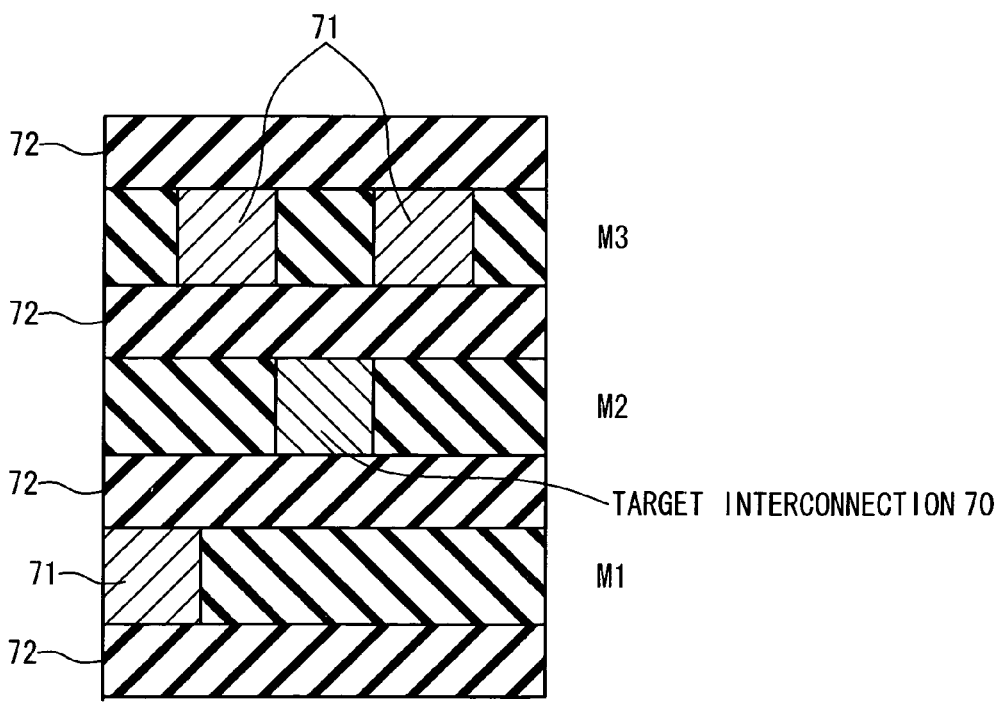
FIG. 3B is a cross-sectional view showing another pattern of the interconnection structure.

FIGS. 3A and 3B illustrate various patterns, showing various interconnection structures including a target interconnection 70. The pattern is shown in a cross-sectional structure. In FIGS. 3A and 3B, a plurality of interconnection layers M1 to M3 are shown as examples. Also, the target interconnection 70 is formed in the interconnection layer M2, for example. Another interconnection 71 is formed around the target interconnection 70, and an interlayer insulating film 72 is formed between the interconnection layers. The shape (width and thickness) and peripheral environment of the target interconnection 70 are different between FIGS. 3A and 3B, and the parasitic RC of the target interconnection 70 is also different.

The library building section 31 automatically generates various possible patterns, and calculates (simulates) the parasitic RC for each of the various patterns. The calculated parasitic RC (RC parameter) is stored in the RC library 11 in the storage unit 10. That is, the RC library 11 shows the RC parameters for the various patterns. Here, according to the present invention, the RC library 11 shows a plurality of RC parameter under "a plurality of conditions" for a single pattern. The plurality of conditions correspond to various types of variation at the manufacturing (process variation). The plurality of conditions will be described later in detail. Additionally, the RC library 11 just needs to be carried out only once in advance for one technology (process). The same RC library 11 is used for all the products that are based on the same technology.

Step S20:

A layout of an LSI that corresponds to the netlist 12 is determined by an automatic layout tool and manual operation not shown. The layout data 13 showing the determined layout is stored in the storage unit 10.

Step S30:

Next, the LPE process (parasitic RC extracting process) is carried out by the RC extracting section 32 in the LPE tool 30. First, the RC extracting section 32 (the processing unit 20) reads the netlist 12 and the layout data 13 stored in the storage unit 10.

Figure 4:
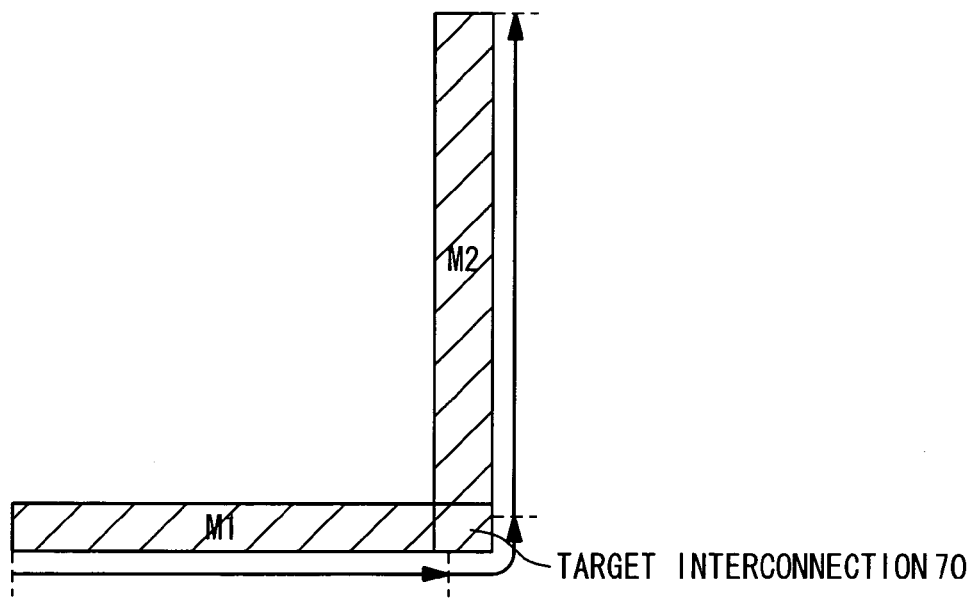
FIG. 4 is a conceptual diagram showing a parasitic RC extracting process.

Step S40:

Secondly, the RC extracting section 32 extracts (calculates) the parasitic RC for every interconnection contained in a layout shown by the layout data 13. FIG. 4 is a conceptual diagram showing the parasitic RC extracting process. A layout of one target interconnection 70 is shown in FIG. 4. This target interconnection 70 includes a first interconnection formed in an interconnection layer M1 and a second interconnection formed in an interconnection layer M2, for example. In the parasitic RC extracting process, the target interconnection 70 is analyzed, as shown by an arrow in FIG. 4, for example. Here, a pattern that is in accordance with an interconnection structure (cross-sectional structure) at each point is selected by referring to the above RC library 11. For example, patterns different from each other are selected for the first interconnection and the second interconnection. By reading the RC parameter corresponding to the selected pattern, the parasitic RC relevant to the target interconnection 70 is calculated. The parasitic RC of all the interconnections is calculated by considering each of the interconnections in the layout as the target interconnection 70 in order.

Figure 5A:
FIGS. 5A and 5B are conceptual diagrams showing a netlist and a netlist 14 with parasitic RC, respectively.
Figure 5B:
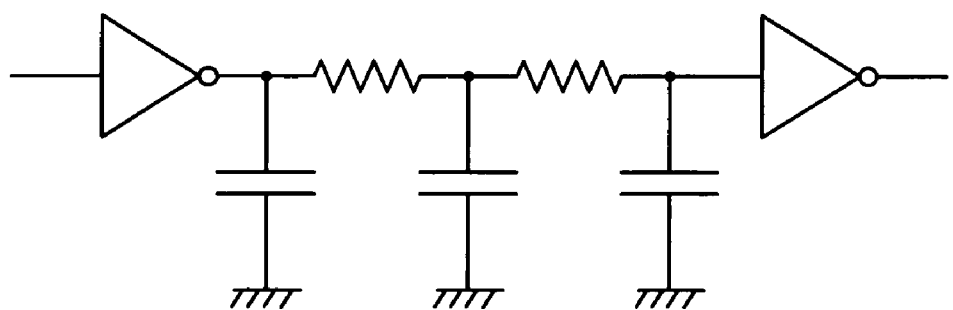

Step S50:

The RC extracting section 32 generates the netlist with parasitic RC 14, by adding the parasitic RC calculated at the step S40, to the netlist 12. FIGS. 5A and 5B are conceptual diagrams showing the netlist 12, and the netlist 14 with parasitic RC, respectively. As an example, FIGS. 5A and 5B show the netlist 12 and the netlist with parasitic RC 14 relevant to the target interconnection 70 shown in FIG. 4. As shown in FIGS. 5A and 5B, a parasitic resistance and a parasitic capacitance are added to the netlist with parasitic RC 14. The RC extracting section 32 outputs the generated netlist with parasitic RC 14 to be stored in the storage unit 10.

Step S60:

Next, the operation verifying process (the delay verifying process and the timing verifying process) of the designed LSI are carried out by the verifying tool 40. The verifying tool 40 (the processing unit 20) reads the netlist with parasitic RC generated at the step S50 from the storage unit 10, and carries out the operation verifying process based on the read-out netlist with parasitic RC 14. When the result of the operation verifying process indicates a "fail" state (step S70: No), the step S20 is again carried out. That is, correction of the layout is carried out based on the verifying process result, and the layout data 13 is again generated. After that, the LPE process and the operation verifying process are again carried out. When the result of the operation verifying process indicates a "passed" state (step S70: Yes), the layout data 13 generated at the step S20 is adopted as a final layout data.

As would be clarified later, the present invention makes it possible to reduce a process time at the step S40. Also, the number of times to return from the step 70 to the step 20 is reduced. As a result, the design time of the semiconductor device is greatly reduced. Detailed description of the present invention is given below, based on the above overview.

1. Process Variation

First, "process variation" relevant to the present invention will be described in detail. In an actual manufacturing process of a semiconductor device, a structure of an interconnection and so on, may not be manufactured as precisely as is intended. In other words, a cross-sectional area (width and thickness) of the interconnection, a thickness of an interlayer insulating film, and so on may give variation from a desired value. Such a process variation affect the parasitic RC of the interconnection, further affecting a delay.

Figure 6A:
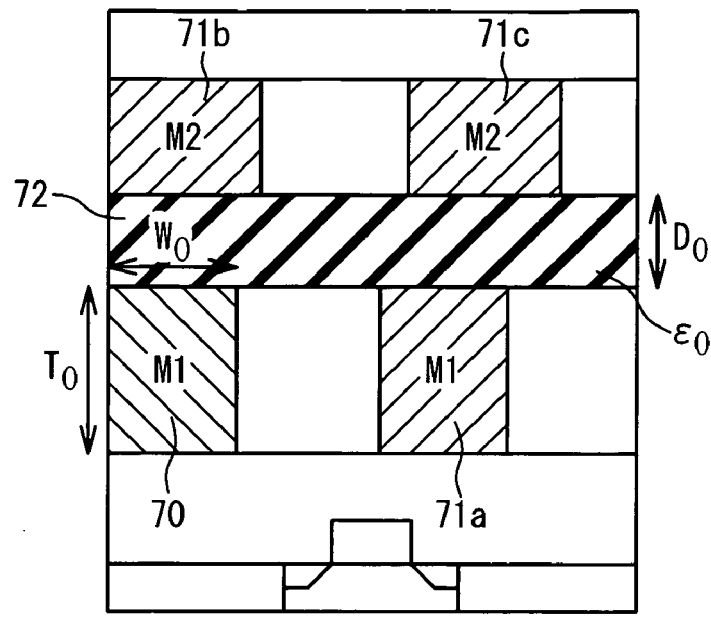
FIGS. 6A and 6B are conceptual diagrams of cross-sectional structures showing process variation.
Figure 6B:
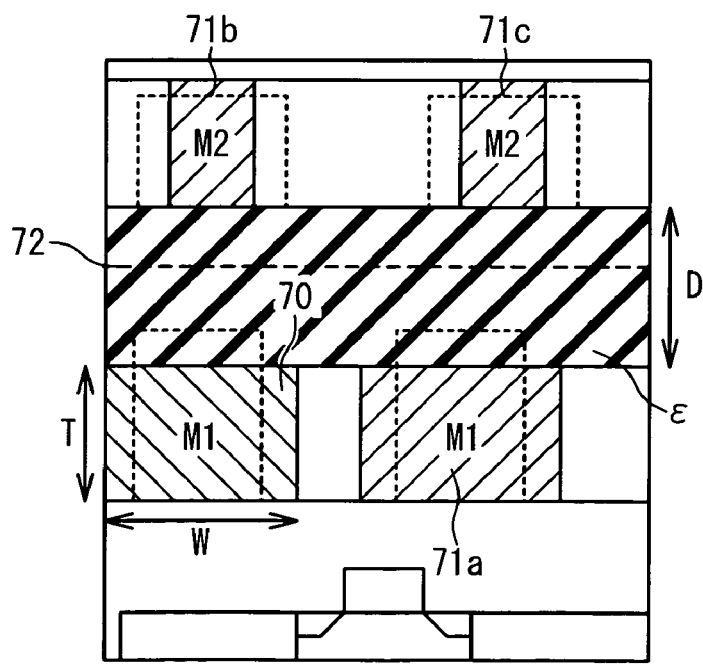

FIGS. 6A and 6B are conceptual diagrams of cross-sectional structures showing the process variation, and shows a "certain pattern" that includes the target interconnection 70. FIG. 6A shows a pattern desired in the design, while FIG. 6B shows a pattern that is actually manufactured. In FIGS. 6A and 6B, the target interconnection 70 is formed in the interconnection layer M1, and interconnections 71a to 71c are formed therearound. The interlayer insulating film 72 is formed between the interconnection layers M1 and M2.

As shown in FIG. 6A, a desired width and film thickness of the target interconnection 70 are $W_O$ and $T_O$, respectively. Also, a desired thickness and dielectric constant of the interlayer insulating film 72 are $D_O$ and $\in_O$, respectively. A set of these desired values is referred to as a "center condition" hereinafter. In general, the structure of the semiconductor device actually manufactured does not perfectly satisfy the center condition. Then, the width and film thickness of the target interconnection 70, and the thickness and dielectric constant of the interlayer insulating film 72 become W, T, D, and ∈, respectively, as shown in FIG. 6B. In FIG. 6B, a dotted line indicates the center condition. The width W and thickness T of the interconnection layer have the greatest influence among factors relevant to the parasitic RC. Variations of the width W and the thickness T from the center condition differ according to a chip. Therefore, a standard deviation $\sigma_W$ of a width distribution, and a standard deviation $\sigma_T$ of a film thickness distribution in the target interconnection 70 in the manufacturing can be defined. At this time, the width W and the film thickness T are expressed by the following equations (1) by use of predetermined coefficients $\alpha_W$ and $\alpha_T$.

$$W = W_O + \alpha_W \cdot \sigma_W$$

$$T = T_O + \alpha_T \cdot \sigma_T \qquad (1)$$

Each of the coefficients $\alpha_W$ and $\alpha_T$ can take a value in a range of −A to +A. The value A is 3, for example. At this time, the width W is expressed in a range of $\pm 3\sigma_W$ (a range of 99.7%) from a central value $W_O$, which is statistically enough. The same is applied to the film thickness T. A case where the coefficient $\alpha_W$ is ±A corresponds to a case where the width W varies to a maximum extent. Also, a case where the coefficient $\alpha_T$ is ±A corresponds to a case where the film thickness T varies to a maximum extent.

According to the present invention, correlation mentioned below is considered for the width W and the film thickness T.

Correlation 1:

A correlation does not exist between the width W variation and the film thickness T variation with respect to a certain interconnection. In other words, an event "width W variation" and an event "film thickness T variation" are independent of each other. That is to say, the coefficients $\alpha_W$ and $\alpha_T$ are variables independent of each other. This could be understood from the fact that a process of determining the thickness of an interconnection layer and a process of determining the width of the interconnection are separate in a general manufacturing process of the semiconductor device. For example, as shown in FIGS. 6A and 6B, the width W of the target interconnection 70 is larger than the center condition $W_O$, but the film thickness T is smaller than the center condition $T_O$.

Correlation 2:

A correlation exists between the width W variation of the interconnection with respect to the same interconnection layer. This could be understood from the fact that an interconnection is formed by using a mask and etching in the general manufacturing process of the semiconductor device. For example, when the width W of the target interconnection 70 is larger than the center condition $W_O$ in the interconnection layer M1, the width of the interconnection 71a is also increased as shown in FIGS. 6A and 6B. Also, a correlation exists between the film thickness T variations of the interconnection with respect to the same interconnection layer. This could be understood from the fact that the interconnection layer is formed by using a CMP (Chemical Mechanical Polishing) process in the general manufacturing process of the semiconductor device. For example, when the film thickness T of the target interconnection 70 is smaller than the center condition $T_O$ in the interconnection layer M1, the thickness of the interconnection 71a is also decreased as shown in FIGS. 6A and 6B.

Correlation 3:

A correlation does not exist between the width W variations of the interconnection with respect to a different interconnection layers. Also, a correlation does not exist between the film thickness T variations of the interconnection with respect to the different interconnection layers. This could be understood from the fact that the different interconnection layers are formed in different processes in the general manufacturing process of the semiconductor device. For example, the width W of the target interconnection 70 formed in the interconnection layer M1 is larger than the center condition $W_O$, while the width of the interconnection 71b formed in the interconnection layer M2 is smaller than the center condition, as shown in FIGS. 6A and 6B. Also, the film thickness T of the target interconnection 70 formed in the interconnection layer M1 is smaller than the center condition $T_O$, while the film thickness of the interconnection 71b formed in the interconnection layer M2 is larger than the center condition.

2. Building-up of the RC Library

Next, the building-up of the RC library 11 according to the present invention, namely, the step S10 in FIG. 2 will be described in detail. The RC library 11 stores an RC parameter under a "plurality of conditions" for a single pattern. In addition to the above center condition, the plurality of conditions include a condition for the process variation. Here, factors relevant to the process variation are various, and it is not practical to consider all the combinations of the factors. Since the result of the LPE process is used for the delay verifying process, it is just necessary to know only the conditions in which a delay is maximized and minimized (referred to as a "corner conditions" hereinafter), among the process variation.

Figure 7:
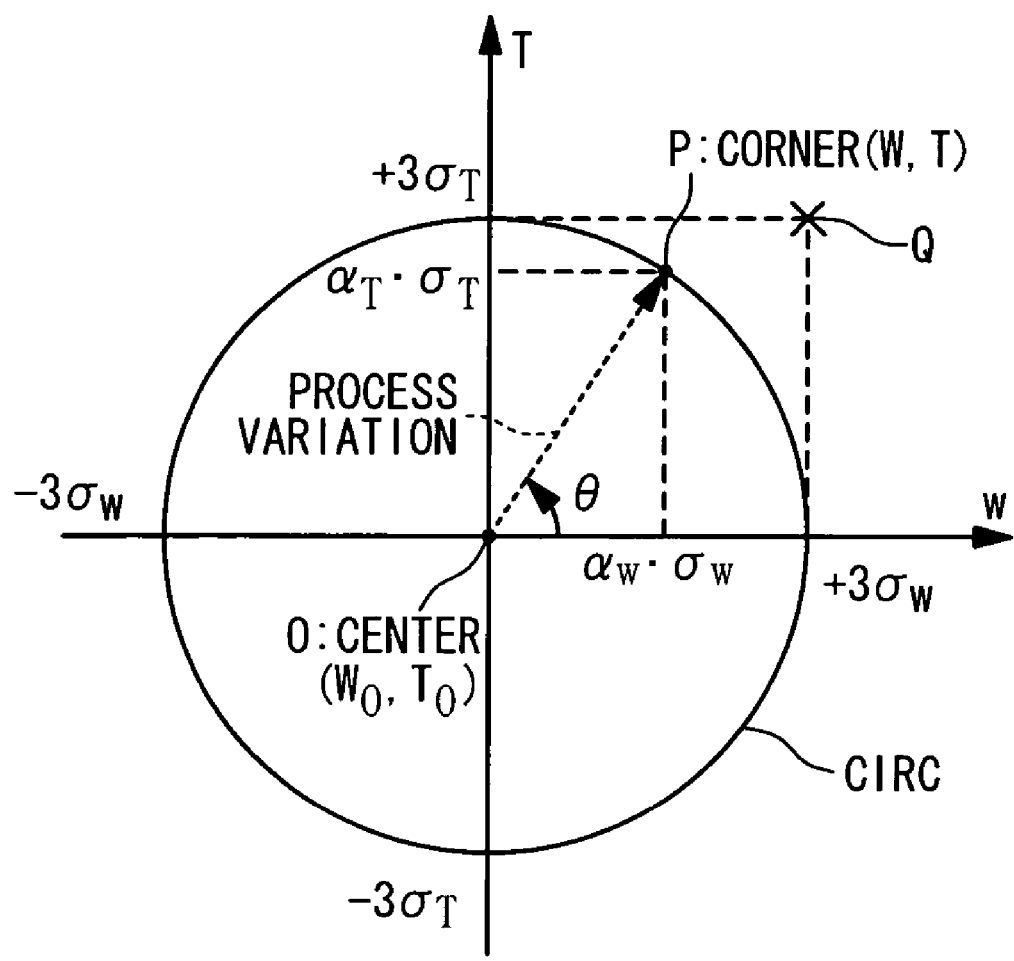
FIG. 7 is a conceptual diagram showing a method of determining corner conditions according to the present invention.

FIG. 7 is a diagram showing a method of determining the corner conditions according to the present invention. In FIG. 7, the horizontal axis and the vertical axis show the width W and the film thickness T of the interconnection (the target interconnection 70), respectively. An origin O shows the center condition ($W_0$, $T_0$). In FIG. 7, therefore, a distance from the origin O indicates the "process variation". By referring to the equations (1), a coordinate of a point P on the plane in FIG. 7 is expressed as ($\alpha_W \sigma_W$, $\alpha_T \sigma_T$). As stated above, each of the coefficients $\alpha_W$ and $\alpha_T$ can take a value of −3 to +3, for example. At this time, the width W is expressed in a range of ±3$\sigma_W$ (range of 99.7%) from the center condition $W_0$, which is statistically enough. The same is applied to the film thickness T.

A case where the coefficient $\alpha_W$ is ±3 corresponds to a case where the width W varies to a maximum extent. Also, a case where the coefficient $\alpha_T$ is ±3 corresponds to a case where the film thickness T varies to a maximum extent. It should be noted here as stated above, that the correlation does not exist between the width W variation and the film thickness T variation, and that the coefficients $\alpha_W$ and $\alpha_T$ are the variables independent of each other (the correlation 1). This means that a probability P that both of the width W and the film thickness T vary to a maximum extent at the same time ($\alpha_W = \pm 3$, $\alpha_T = \pm 3$) is extremely small. For examples, variation shown by the point Q (+3$\sigma_W$, +3$\sigma_T$) in FIG. 7 is overly negative. If such an extreme case is taken into consideration, it is necessary to generate a layout data that supports the extreme case. This means increase in the number of times to repetition of a layout generating process and a verifying process, and indicates increase in the TAT. According to the present invention, therefore, the extreme case as mentioned above is excluded from consideration, though the process variation is taken into consideration. Such exclusion is referred to as "statistical relaxation" hereinafter, in the specification. More specifically, restriction expressed by the following equation (2) is imposed on the coefficients $\alpha_W$ and $\alpha_T$.

$$\sqrt{\alpha_W^2 + \alpha_T^2} = 3 \tag{2}$$

In other words, the restriction that a sum of squares of ratios of the process variations ($\alpha_W$, $\alpha_T$) to the standard deviations is constant, is imposed to the width W and the film thickness T. Under this restriction, it is sufficient that the corner conditions in which the delay of the target interconnection 70 is maximized and minimized is calculated. That is, the point P on a circle CIRC in FIG. 7 that corresponds to the case where the delay is maximized or minimized is searched through a simulation calculation. As a result, the case where both the width W and the film thickness T simultaneously vary to a maximum extent is excluded. In that simulation calculation, other factors such as a thickness D and the dielectric constant ∈ of the interlayer insulating film 72 are assumed to be the center condition.

Figure 8:
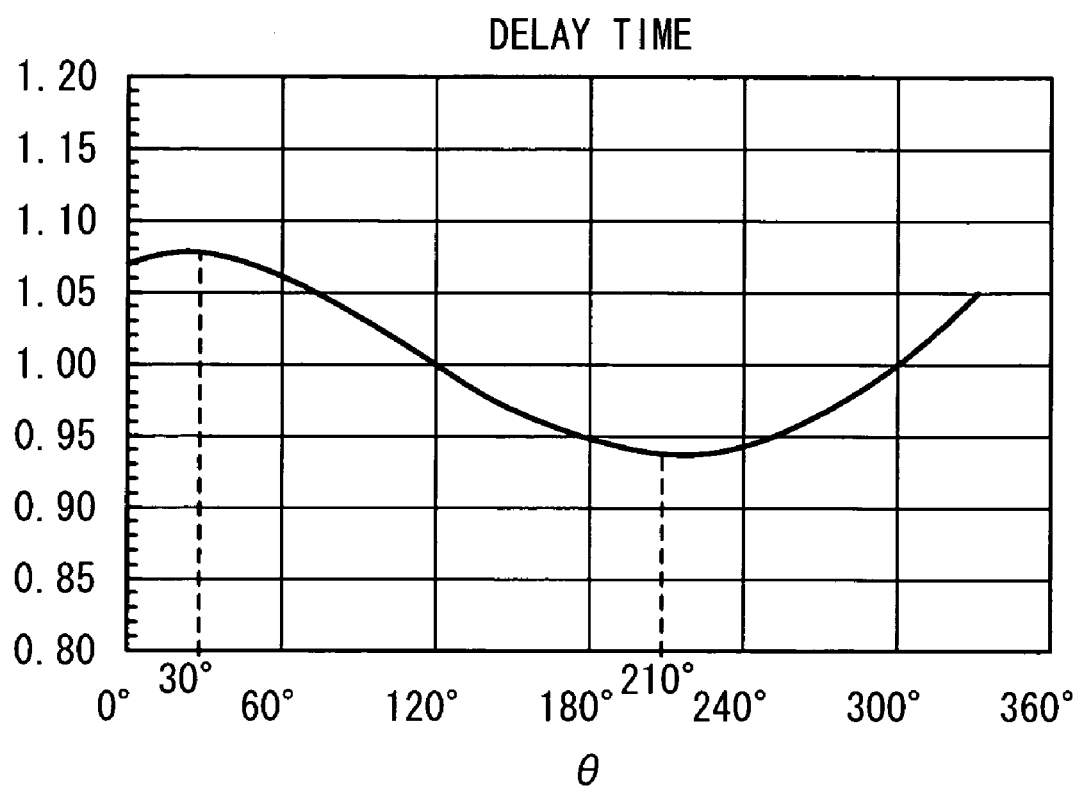
FIG. 8 is a graph showing dependence of a delay time on an angle $\theta$.
Figure 9:
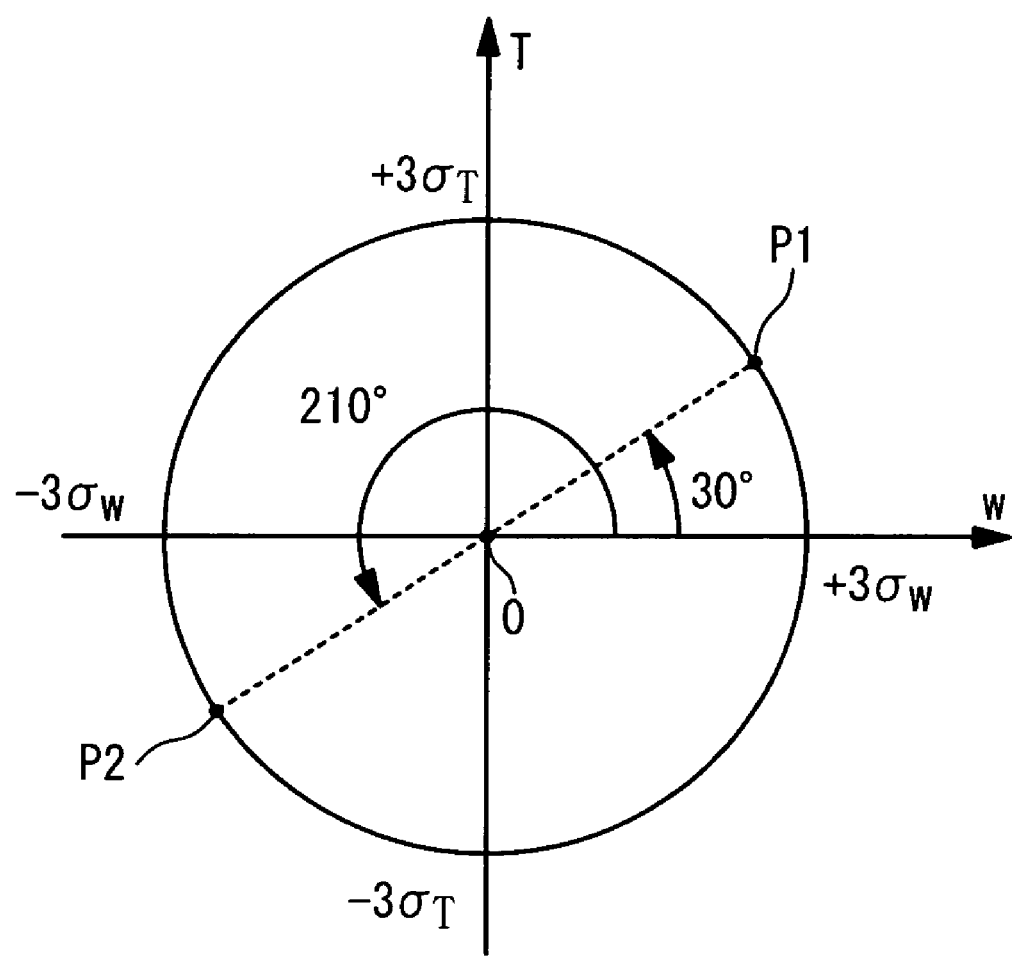
FIG. 9 is a conceptual graph showing corner conditions.

FIG. 8 shows one example of the result of the above simulation. In FIG. 8, the vertical axis shows a delay time obtained through the simulation for a certain pattern. The horizontal axis shows an angle θ from the W axis of the point P (see FIG. 7). As shown in FIG. 8, the delay time changes in a sine curve form in accordance with the angle θ. In this example, the delay time is maximized when θ is 30 degrees, and is minimized when θ is 210 degrees. Therefore, a point P1 (θ is 30 degrees) and a point P2 (θ is 210 degrees) shown in FIG. 9 correspond to the corner conditions of the simulated pattern. The point P1 in which the delay is maximized and the point P2 in which the delay is minimized are away from each other by 180 degrees.

Figure 10A:
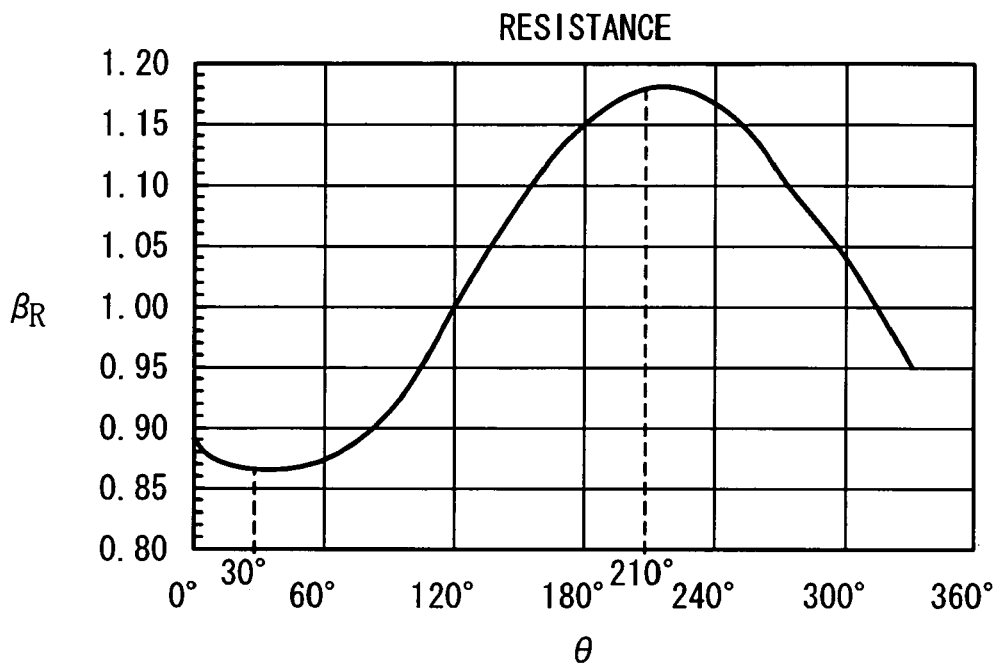
FIG. 10A is a graph showing dependency of parasitic resistance on the angle $\theta$.
Figure 10B:
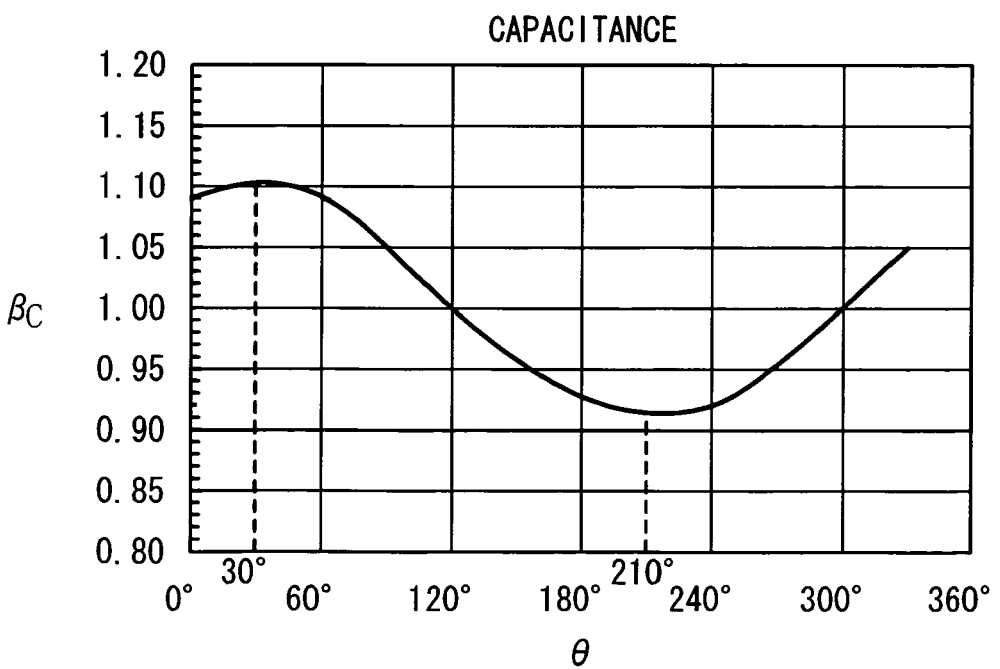
FIG. 10B is a graph showing dependency of parasitic capacitance on the angle $\theta$.

FIG. 10A is a graph showing dependency of the parasitic resistance on the angle θ, and FIG. 10B is a graph showing dependency of the parasitic capacitance on the angle θ. In FIG. 10A, the vertical axis shows a ratio $\beta_R$ of a parasitic resistance calculated through the simulation, to the parasitic resistance in the center condition ($W_0$, $T_0$). Also, in FIG. 10B, the vertical axis shows a ratio $\beta_C$ of a parasitic capacitance calculated through the simulation, to the parasitic capacitance in the center condition. The ratios $\beta_R$ and $\beta_C$ are referred to as "corner ratios" hereinafter.

As shown in FIGS. 10A and 10B, the parasitic resistance and the parasitic capacitance relevant to the target interconnection 70 change in a sine curve form to the angle θ. In this example, the parasitic resistance is minimized and the parasitic capacitance is maximized at the point P1 (θ is 30 degrees). On the other hand, the parasitic resistance is maximized and the parasitic capacitance is minimized at the point P2 (θ is 210 degrees). The reason why the changes in the parasitic resistance and the parasitic capacitance are opposite is that the resistance is expressed as a decreasing function to an interconnection cross-sectional area, while the capacitance is expressed as an increasing function to the interconnection cross-sectional area. Also, the change in the parasitic resistance shown in FIG. 10A is same as the change of the parasitic resistance multiplied by the parasitic capacitance (R multiplied by C). This is because the resistance is more sensitive to the change of the form than the capacitance, as seen from comparison of the amplitude of the lines shown in FIGS. 10A and 10B. Additionally, in the pattern of this example, the case where the parasitic resistance is minimized and the parasitic capacitance is maximized, corresponds to the case where the delay time is maximized (the point P1). Also, the case where the parasitic resistance is maximized and the parasitic capacitance is minimized, corresponds to the case where the delay time is minimized (the point P2). This tendency depends on kinds of patters. In some cases, the correspondence is opposite to the correspondence relation shown in FIGS. 10A and 10B. However, the positions (angles) of the points P1 and P2 do not change even if the correspondence is opposite.

According to the present invention as described above, the "statistical relaxation" is taken into consideration, and the corner conditions are calculated in which the delay time is maximized and minimized. In other words, the conditions that take process variation into consideration include two corner conditions (first and second conditions) at least. Although only the width W and the film thickness T of the interconnection are taken into consideration in the above description, other factors relevant to the delay time may be considered as well. Examples of the other factors are such as the thickness of the interlayer insulting film, the dielectric constant of the interlayer insulating film, and a via-contact resistance. At this time, each of the other factors is set to vary to a maximum extent (±3σ).

FIG. 11 is a table showing the corner conditions in the present invention. For example, under the first condition, the width W, and the film thickness T are given as $\alpha_W 1 \cdot \sigma_W$, and $\alpha_T{}^{1*\sigma}{}_T$, and the thickness of the interlayer insulating film, the dielectric constant, and the via-contact resistance are given as $-3\sigma$, $+3\sigma$, and $+3\sigma$, respectively. The coefficients $\alpha_{W1}$ and $\alpha_{T1}$ correspond to the point P1, for example, and correspond to a case where the parasitic capacitance is maximized and the parasitic resistance is minimized ($C_{max}$ and $R_{min}$). Under a third condition, the width W, the film thickness T, the thickness of the interlayer insulating film, the dielectric constant, and the via-contact resistance are given as $\alpha_W 3*\sigma_W$, $\alpha_T 3*\sigma_T$, $+3\sigma$, $-3\sigma$, and $-3\sigma$, respectively. The coefficients $\alpha_{W3}$ and $\alpha_{T3}$ correspond to the point P1, and correspond to the case where the parasitic capacitance is maximized and the parasitic resistance is minimized ($C_{max'}$ and $R_{min'}$). That is, the coefficients $\alpha_{W1}$ and $\alpha_{W3}$ are equal, and the coefficients $\alpha_{T1}$ and $\alpha_{T3}$ are equal. However, variation of the other factors are different between the first and third conditions. The variation of the other factors are set to one of $+3\sigma$ or $-3\sigma$ in the first condition, while the variation of the other factors are set to the other in the third condition. Therefore, the calculated parasitic RC are different between the first and third conditions.

Under the second condition, the width W, the film thickness T, the thickness of the interlayer insulating film, the dielectric constant, and the via-contact resistance are given as $\alpha_W 2*\sigma_W$, $\alpha_T 2*\sigma_T$, $-3\sigma$, $+3\sigma$, and $+3\sigma$, respectively. The coefficients $\alpha_{W2}$ and $\alpha_{T2}$ correspond to the point P2, for example, and correspond to the case where the parasitic capacitance is minimized and the parasitic resistance is maximized ($C_{min}$ and $R_{max}$). Under a fourth condition, the width W, the film thickness T, the thickness of the interlayer insulating film, the dielectric constant, and the via resistance are given as $\alpha_W 4*\sigma_W$, $\alpha_T 4*\sigma_T$, $+3\sigma$, $-3\sigma$, and $-3\sigma$, respectively. The coefficients $\alpha_{W4}$ and $\alpha_{T4}$ correspond to the point P2, and correspond to the case where the parasitic capacitance is minimized and the parasitic resistance is maximized ($C_{min'}$ and $R_{max'}$). That is, the coefficients $\alpha_{W2}$ and $\alpha_{W4}$ are equal, and the coefficients $\alpha_{T2}$ and $\alpha_{T4}$ are equal. However, variation of the other factors are different between the second and fourth conditions. The variation of the other factors are set to one of $+3\sigma$ or $-3\sigma$ in the second condition, while the variation of the other factors are set to the other in the fourth condition. Therefore, calculated parasitic RC are different between the second and fourth conditions.

In this way, the four corner conditions of the present invention are determined. It is sufficient that the parasitic RC is calculated through simulation for each of the five conditions of the center condition (the zero condition) and the four corner conditions (the first to fourth conditions). Consequently, the RC library 11 of the present invention is built up.

Figure 12:
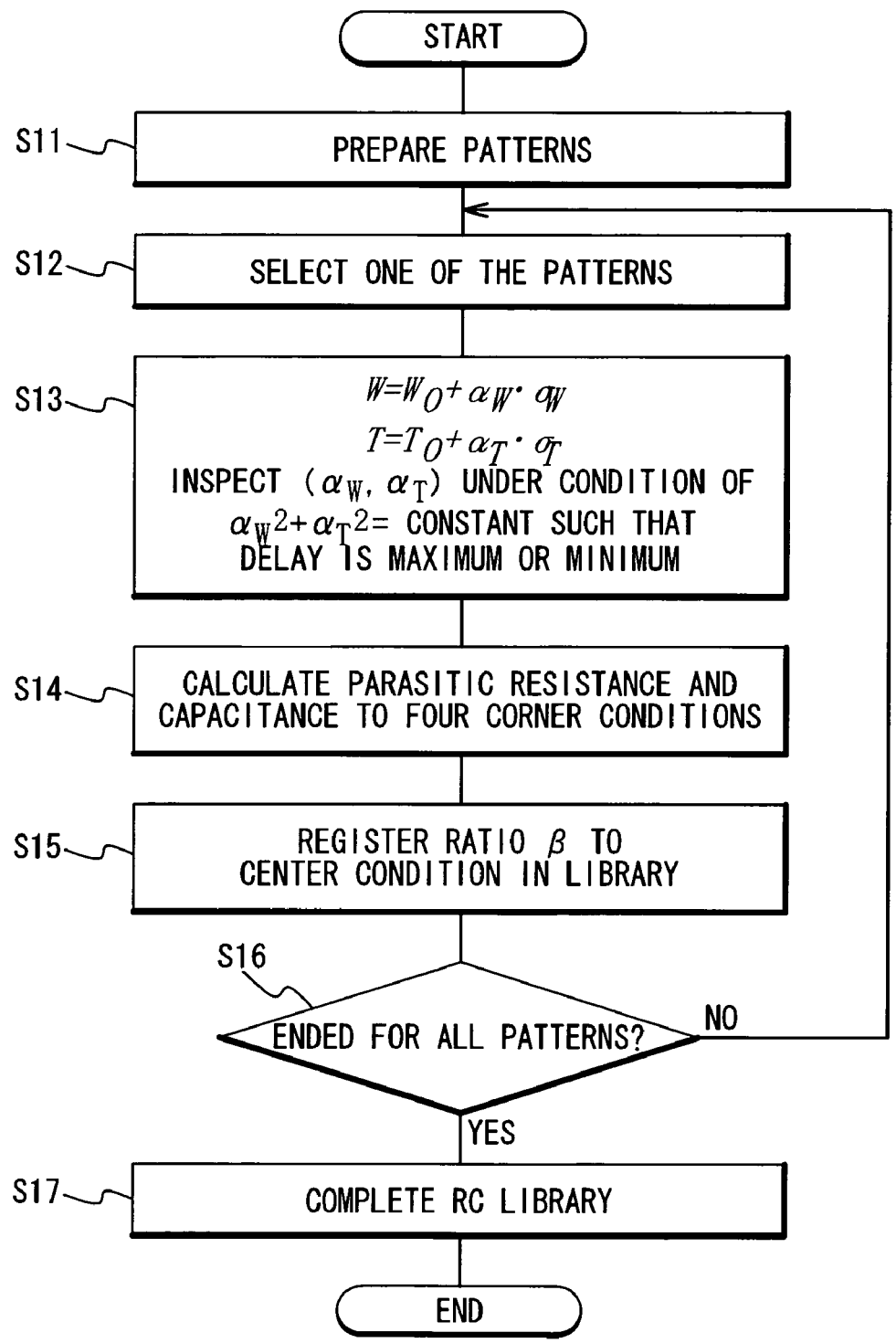
FIG. 12 is a flow chart showing a method of building up an RC library in the present invention.

FIG. 12 is a flow chart briefly showing a building method of the RC library 11 in the present invention, and showing the contents included at the step S10. First of all, a plurality of patterns that include the target interconnection 70 (see FIGS. 3A and 3B) are prepared (step S11). Then, one pattern is selected from the plurality of patterns (step S12). Subsequently, a point at which a delay is maximized and minimized is searched under the condition shown by the above equations (1) in consideration of the statistical relaxation (step S13). Consequently, the four corner conditions are determined (see FIG. 11). Subsequently, the parasitic RC under the center condition is calculated, and the parasitic RC under each of the four corner conditions is calculated (step S14).

Next, an RC parameter showing the calculated parasitic RC is stored in the RC library 11 (step S15). With respect to the center condition, for example, the calculated parasitic RC is stored as the RC parameter with no change. On the other hand, with respect to the four corner conditions, the ratio (corner ratios $\beta_R$ and $\beta_C$) to the parasitic RC under the center condition is stored as the RC parameter. As a result, a calculation time in the LPE process is reduced as described later. When a calculation process is not completed for all the patters (step S16: No), the above steps S13 to S15 are repeated for patterns where calculation is not yet completed. If the calculation process is completed for all the patterns (step S16: Yes), the RC library 11 of the present invention is completed (step S17).

FIG. 13 shows an example of the completed RC library 11. As shown in FIG. 13, the RC library 11 stores the RC parameters (a parasitic capacitance parameter and a parasitic resistance parameter) for a plurality of patters. Here, one data block is allocated to each of the patterns, and each data block stores the RC parameter for a plurality of conditions. That is, the RC library 11 stores the RC parameter under the center condition (Center) and the four corner conditions (max, min, max', and min') for a single pattern. Under the center condition in a pattern No. 1, for example, a capacitance value C1 (center capacitance value) is stored as the parasitic capacitance parameter, and a resistance value R1 (center resistance value) is stored as the parasitic resistance parameter. Under the four corner conditions, a corner ratio $\beta_C 1$ ($\beta_C 1$-1 to $\beta_C 1$-4) is stored as the parasitic capacitance parameter, and a corner ratio $\beta_R 1$ ($\beta_R 1$-1 to $\beta_R 1$-4) is stored as the parasitic resistance parameter.

In this way, according to the RC library 11 of the present invention, the process variation is taken into consideration, but is narrowed down to the four corner conditions. Therefore, a memory capacity can be saved. Also, the time for the LPE process is reduced by using the RC library 11 built in the above way, as described below. Additionally, the RC library 11 just needs to be carried out only once beforehand, for one technology (minimum size). The same RC library 11 is used for all the products that are based on the same technology.

3. LPE Process (RC Extracting Process)

Figure 14:
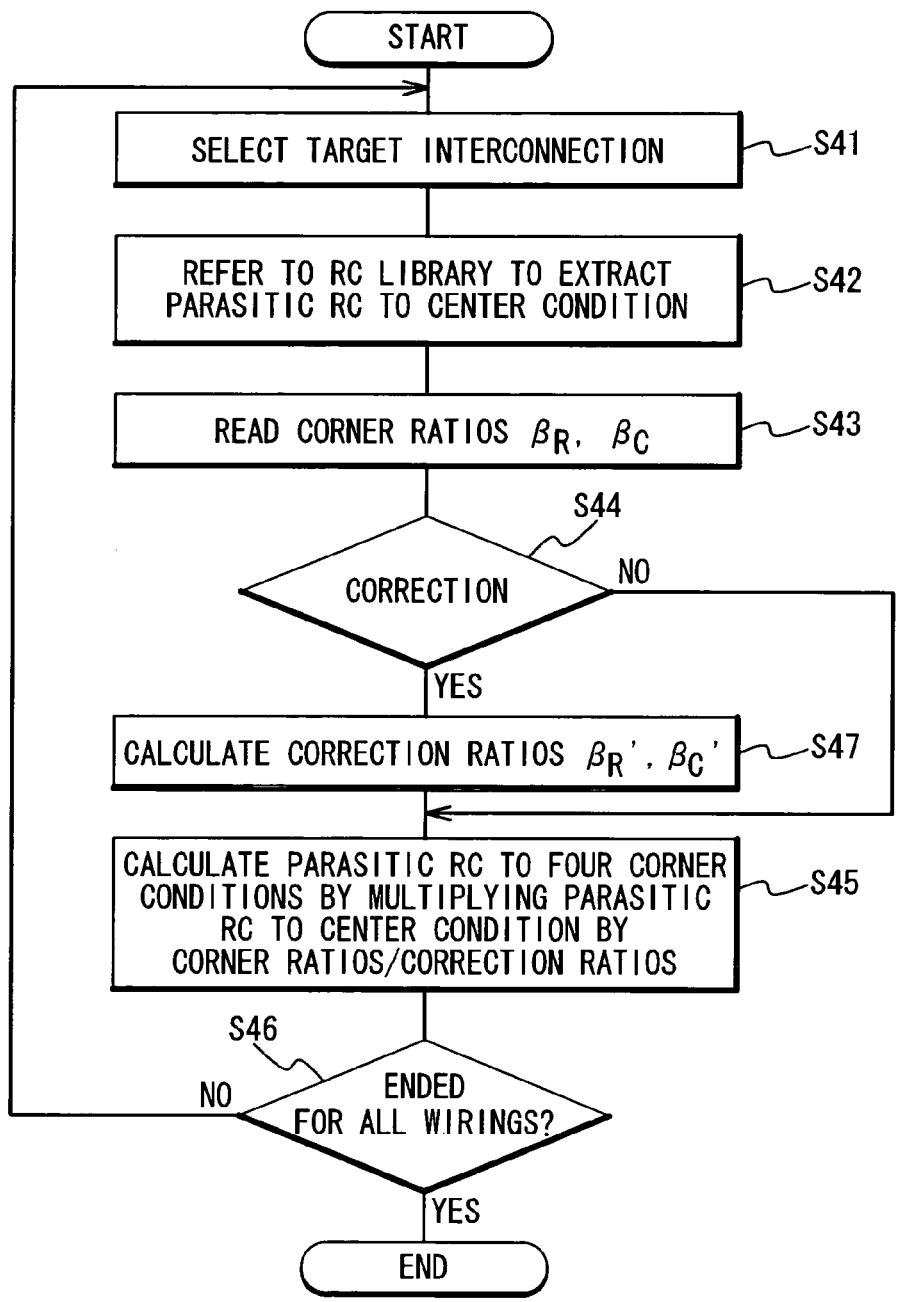
FIG. 14 is a flow chart showing an LPE process in the present invention.

Next, the LPE process of the present invention, namely, the step 40 in FIG. 2, will be described in detail. FIG. 14 is a flow chart briefly showing the LPE process in the present invention, and shows the contents included at the step S40. In this LPE process, the RC library 11 built in the above way, is referred to.

First Embodiment

First, one target interconnection 70 is selected from a plurality of interconnections included in a layout of an LSI under design (step S41). Subsequently, the RC library 11 shown in FIG. 13 is referred to extract a parasitic RC of the target interconnection 70 under the center condition Center (step S42). The extracting process of the parasitic RC is built in the method shown in FIG. 4. That is, various patterns is referred to in order, for one target interconnection 70. For example, FIG. 15 conceptually shows the extracting process of the parasitic RC in this embodiment. In this example, the target interconnection 70 includes a first interconnection formed in an interconnection layer M1, a second interconnection formed in an interconnection layer M2, and a third interconnection formed in an interconnection layer M3. At this time, the center capacitance value C1 and the center resistance value R1 in the pattern 1 shown in FIG. 13 are used as parasitic RC relevant to the first interconnection, for example. In the same way, the pattern 2 is referred to extract the parasitic RC of the second interconnection, and the pattern 3 is referred to extract the parasitic RC of the third interconnection. Thus, the parasitic RC of the target interconnection 70 under the center condition is extracted.

Next, a parasitic RC of the target interconnection 70 under the corner conditions is extracted. More specifically, the corner ratios $\beta_R$ and $\beta_C$ (RC parameters) are read for each of the plurality of patterns that are referred to at the step S42 (step S43). For example, corner ratios $\beta_C$1-1 to $\beta_C$1-4, and $\beta_R$1-1 to $\beta_R$1-4 in the pattern 1 are read out. Then, it is selected whether or not a correction process is carried out for the read-out corner ratios (step S44). In the first embodiment of the present invention, the correction process is not carried out, and the read-out corner ratios $\beta_R$ and $\beta_C$ are used for the next calculation with no change (step S44: No). More specifically, a resistance value R (Corner) under a certain corner condition is calculated by multiplying the center resistance value R (Center) obtained at the step S42 and a certain corner ratio $\beta_R$ together. Also, a capacitance value C (Corner) under a certain corner condition is calculated by multiplying the center capacitance value C (Center) obtained at the step S42 and a certain corner ratio $\beta_C$ (step S45).

$$R(\text{corner}) = \beta_R \cdot R(\text{center})$$

$$C(\text{corner}) = \beta_C \cdot C(\text{center}) \quad (3)$$

Figure 15:
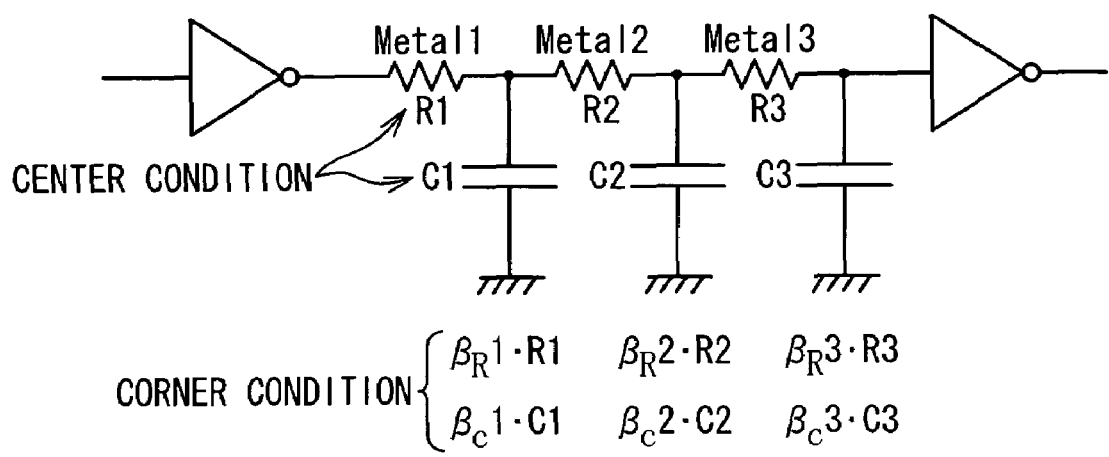
FIG. 15 is a conceptual diagram showing an extracting process of parasitic RC in a first embodiment of the present invention.

For example, a case is discussed here, where the parasitic RC under the first condition relevant to the target interconnection 70 shown in FIG. 15 is calculated. In that case, the calculation shown by the above equations (3) is carried out for each of the first to third interconnections. More specifically, the parasitic resistance under the first condition is calculated by multiplying the center resistance value R1 and the corner ratio $\beta_R$1-1, in case of the first interconnection in the pattern 1. Also, the parasitic capacitance under the first condition is calculated by multiplying the center capacitance value C1 and the corner ratio $\beta_C$1-1. Also, for the second interconnection adaptable for the pattern 2, the parasitic resistance under the first condition is calculated by multiplying the center resistance value R2 and the corner ratio $\beta_R$2-1. Also, the parasitic capacitance under the first condition is calculated by multiplying the center capacitance value C2 and the corner ratio $\beta_C$2-1. As for the third interconnection adaptable for the pattern 3, the parasitic resistance under the first condition is calculated by multiplying the center resistance value R3 and the corner ratio $\beta_R$3-1. Also, the parasitic capacitance under the first condition is calculated by multiplying the center capacitance value C3 and the corner ratio $\beta_C$3-1. The same process is carried out for the other corner conditions (the second to fourth conditions) as well. Thus, the parasitic RC of one target interconnection 70 under the four corner conditions is extracted.

It has already been carried out at the step S42, which of the plurality of patterns stored in the RC library 11 is adaptable for an interconnection. At the step S45, therefore, it is not necessary to carry out a matching process of interconnection and any of the plurality of patterns stored in the RC library 11. Additionally, it is possible to calculate the parasitic RC under the four corner conditions with the easy calculation shown by the equations (3), since the RC parameter relevant to the four corner conditions is stored in the form of the corner ratios $\beta_R$ and $\beta_C$. Therefore, the load on a computer is reduced, and a calculation speed is improved.

When the RC extracting process is not yet completed for all the interconnections included in the layout (step S46: No), another interconnection is set as the target interconnection 70, and the steps S42 to S45 are repeated. If the RC extracting process is completed for all the interconnections included in the layout (step S46: Yes), the LPE process is finished.

As described above, according to the present invention, various conditions showing the process variation are narrowed down to the above first to fourth conditions. At the step S50 shown in FIG. 2, therefore, only four kinds of the netlists with parasitic RC 14 are generated in one LPE process. Then, it is sufficient that at the step S60, the delay verifying process is carried out only to the four kinds of the netlists with parasitic RC 14. Consequently, the times for one LPE process and delay verifying process are reduced. That is to say, reduction in the design time of the semiconductor device is realized.

Further, according to the present invention, the "statistical relaxation" is taken into consideration when the RC parameter under the first to fourth conditions is calculated. That is, a case that a probability is statistically very low is excluded from the process variation. Since it is not necessary to support unnecessary cases, a fail rate in the delay verifying process can be reduced. Because of the reduction in the fail rate of the delay verifying process, the number of times to correct the layout and again carry out the delay verifying process is greatly reduced. In other words, the number of times to repeat the layout process and the verifying process is greatly reduced, since it is not necessary to generate the layout data 13 that supports extreme cases. Therefore, the TAT can be reduced, and the design time of the semiconductor device is reduced.

Second Embodiment

According to the second embodiment of the present invention, a correction process to be mentioned later is carried out to the corner ratios $\beta_R$ and $\beta_C$ read out at the above step S43 shown in FIG. 14 (step S47). As a result of the correction process, a correction ratio $\beta_R'$ is derived from the corner ratio $\beta_R$, and a correction ratio $\beta_C'$ is derived from the corner ratio $\beta_C$. Then, by using the derived correction ratios $\beta_R'$ and $\beta_C'$, the parasitic RC of the target interconnection 70 under the corner conditions is extracted. More specifically, a resistance value R (Corner) under a certain corner condition is calculated by multiplying the center resistance value R (Center) obtained at the step S42 and a certain correction ratio $\beta_R'$. Also, a capacitance value C (Corner) under the certain corner condition is calculated by multiplying the center capacitance value C (Center) obtained at the step S42 and a certain correction ratio $\beta_C'$ (step S45).

$$R(\text{corner}) = \beta_R' \cdot R(\text{center})$$

$$C(\text{corner}) = \beta_C' \cdot C(\text{center}) \quad (4)$$

In the second embodiment, the correction ratios $\beta_R'$ and $\beta_C'$ are given by the following equations (5) by use of predetermined correction parameters $\gamma_R$ and $\gamma_C$.

$$\beta_R' = 1 + (\beta_R - 1) \cdot \gamma_R$$

$$\beta_C' = 1 + (\beta_C - 1) \cdot \gamma_C \quad (5)$$

Figure 16:
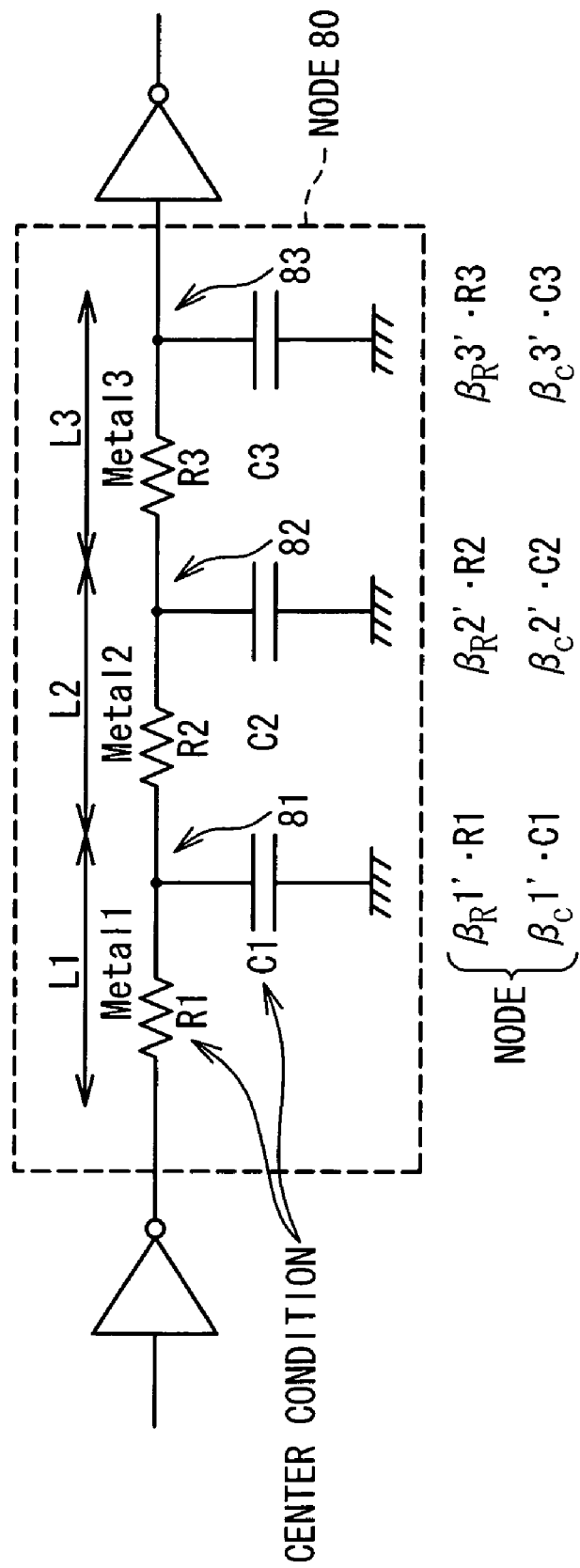
FIG. 16 is a conceptual diagram showing an extracting process of the parasitic RC in a second embodiment of the present invention.

The correction parameters $\gamma_R$ and $\gamma_C$ are determined based on the idea of the "statistical relaxation", as shown below. FIG. 16 is a conceptual diagram showing the extracting process of a parasitic RC in the second embodiment. In FIG. 16, a node 80 includes an interconnection element 81 formed in an interconnection layer M1, an interconnection element 82 formed in an interconnection layer M2, and an interconnection element 83 formed in an interconnection layer M3. Here, a node means a group of interconnections electrically connected. In the node 80, the interconnection elements 81 to 83 are connected in series. The lengths of the interconnection elements 81 to 83 are L1, L2, and L3, respectively. A data on the interconnection length can be obtained from an interconnection length data 15 stored in the storage unit 10. According to the present invention, the "statistical relaxation" is carried out based on the structure of the node 80, and the correction parameters $\gamma_R$ and $\gamma_C$ are determined.

As stated above, in case of different interconnection layers, there is no correlation between variations of the widths W of the interconnections, and between variations of the film thicknesses T of the interconnections (correlation 3). That is, "independence" exists between interconnection layers. Therefore, a probability that a delay is maximized and minimized in all the interconnection layers at the same time, is considered to be extremely small. In other words, it is overly negative to consider that the corner conditions are satisfied in all the interconnection layers at the same time. In FIG. 16, for example, the interconnection elements 81 to 83 are arranged in different interconnection layers M1 to M3, respectively. Therefore, it is not necessary to apply the above corner conditions to all the interconnection elements 81 to 83. According to the present invention, relaxation of the corner conditions is carried out based on the independence between the interconnection layers.

Here, calculation of a parasitic capacitance will be discussed. In each interconnection layer, a parasitic capacitance per unit length is assumed to be given as a common value $C_0$. Also, in each interconnection layer, a corner ratio $\beta_C$ is assumed to be given as a common value $\beta$. Although such assumption is not always satisfied in reality, an error derived from this assumption is considered not to be large. What affects the change in delay is a long interconnection. However, various patterns exist in the long interconnection and the changes in delay are averaged. Therefore, the above assumption is likely to be satisfied in case of the long interconnection. Under the assumption, a total of parasitic capacitance $C_{tot}$ under the center condition is given as $C_{tot}=C_0*(L1+L2+L3)$. On the other hand, the total of parasitic capacitance $C_{tot}$ under the corner conditions is given as $C_{tot}=\beta*C_0*(L1+L2+L3)$. A change in capacitance that results from the interconnection layers M1 to M3 is given as $\Delta C1=C_0*(\beta-1)*L1$, $\Delta C2=C_0*(\beta-1)*L2$, and $\Delta C3=C_0*(\beta-1)*L3$, respectively. Since the independence exists between the respective interconnection layers, a total of the changes is statistically given as the following:

$$(\Delta C1^2+\Delta C2^2+\Delta C3^2)^{1/2}/(\Delta C1+\Delta C2+\Delta C3)=C_0*(\beta-1)*\gamma_C$$

That is to say, in the example shown in FIG. 16, the correction parameters $\gamma_R$ and $\gamma_C$ are given by the following equation (6).

$$\gamma_R = \gamma_C = \frac{\sqrt{L1^2 + L2^2 + L3^2}}{L1 + L2 + L3} \quad (6)$$

As seen from the equation (6), the correction parameters $\gamma_R$ and $\gamma_C$ are larger than 0 and smaller than 1. When all the interconnection lengths L1 to L3 are equal, the correction parameters $\gamma_R$ and $\gamma_C$ are 0.58. Therefore, as seen from the equation (5), the correction ratio $\beta_R'$ is smaller than the corner ratio $\beta_R$, and the correction ratio $\beta_C'$ is smaller than the corner ratio $\beta_C$. This means that the corner conditions are relaxed. That is, variation resulting from the center conditions to be considered, can be further reduced. The corner conditions originally obtained based on the statistical relaxation in the first embodiment, can be further reduced in the second embodiment. Since it is not necessary to support unnecessary cases, the fail rate in the delay verifying process is further reduced. Consequently, the number of times to repeat the layout process and verifying process can be further reduced.

More generally, it is assumed that the node 80 includes an interconnection group in each of N layers (N is a natural number) of interconnection layers. The interconnection group in a certain interconnection layer may include a plurality of interconnection elements. It is assumed that a sum of the lengths of interconnection elements in an interconnection group in each interconnection layer, is given as Li (i is an integer number equal to or larger than 1, and equal to or smaller than N). At this time, the correction parameters $\gamma_R$ and $\gamma_C$ are given as the following equation (7).

$$\gamma_R = \gamma_C = \sqrt{\sum_i^N L_i^2} \Big/ \sum_i^N L_i \quad (7)$$

Figure 17A:
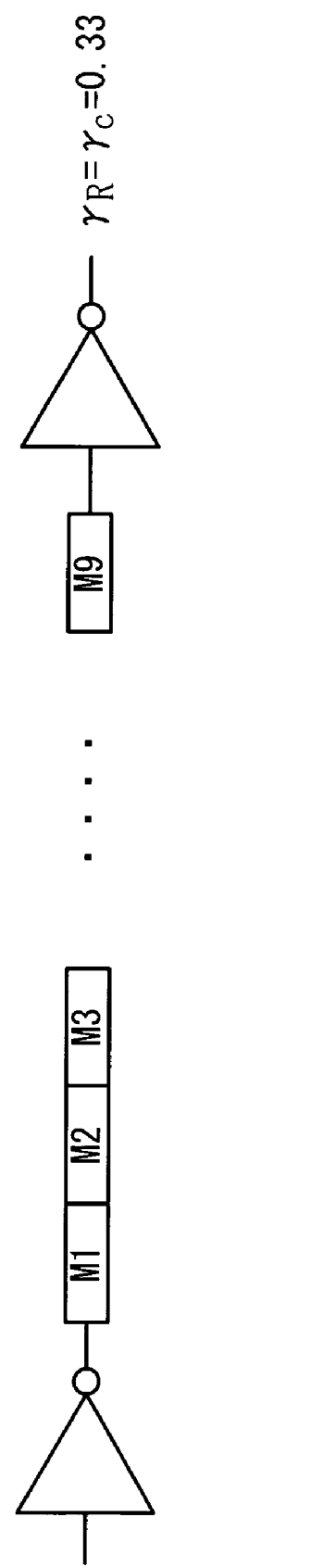
FIGS. 17A and 17B are conceptual diagrams showing an example of a correction process in the second embodiment of the present invention.
Figure 17B:
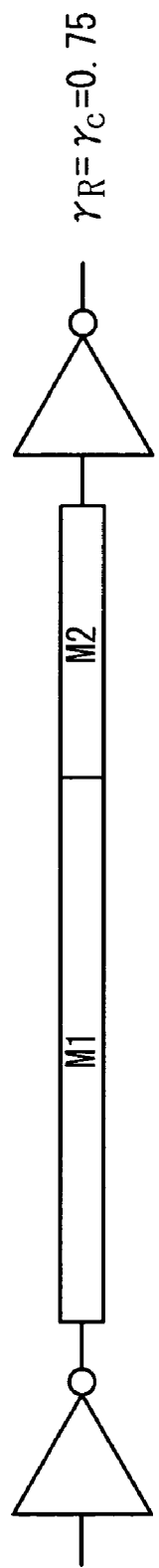

FIGS. 17A and 17B are conceptual diagrams showing an example of the correction process. In FIG. 17A, a node includes nine interconnection groups arranged to the first interconnection layer M1 to the ninth interconnection layer M9. The sum of the lengths of interconnection elements in each interconnection group is equal. In this case, the correction parameters $\gamma_R$ and $\gamma_C$ are calculated to be 0.33, from the above equation (7). In FIG. 17B, a node includes two interconnection groups arranged in the first interconnection layer M1 and the second interconnection layer M2. A ratio of the sum of the lengths of interconnection elements in the interconnection group arranged in the first interconnection layer M1, to the sum of the lengths of interconnection elements in the interconnection group arranged in the second interconnection layer M2, is assumed to be 2:1. In this case, the correction parameters $\gamma_R$ and $\gamma_C$ are calculated to be 0.75 from the equation (7). Effect of the statistical relaxation is more apparent in the example of FIG. 17A than in the example of FIG. 17B. This is because a case where variation are maximized "at the same time" in all the nine independent interconnection groups is practically very rare.

Figure 18:
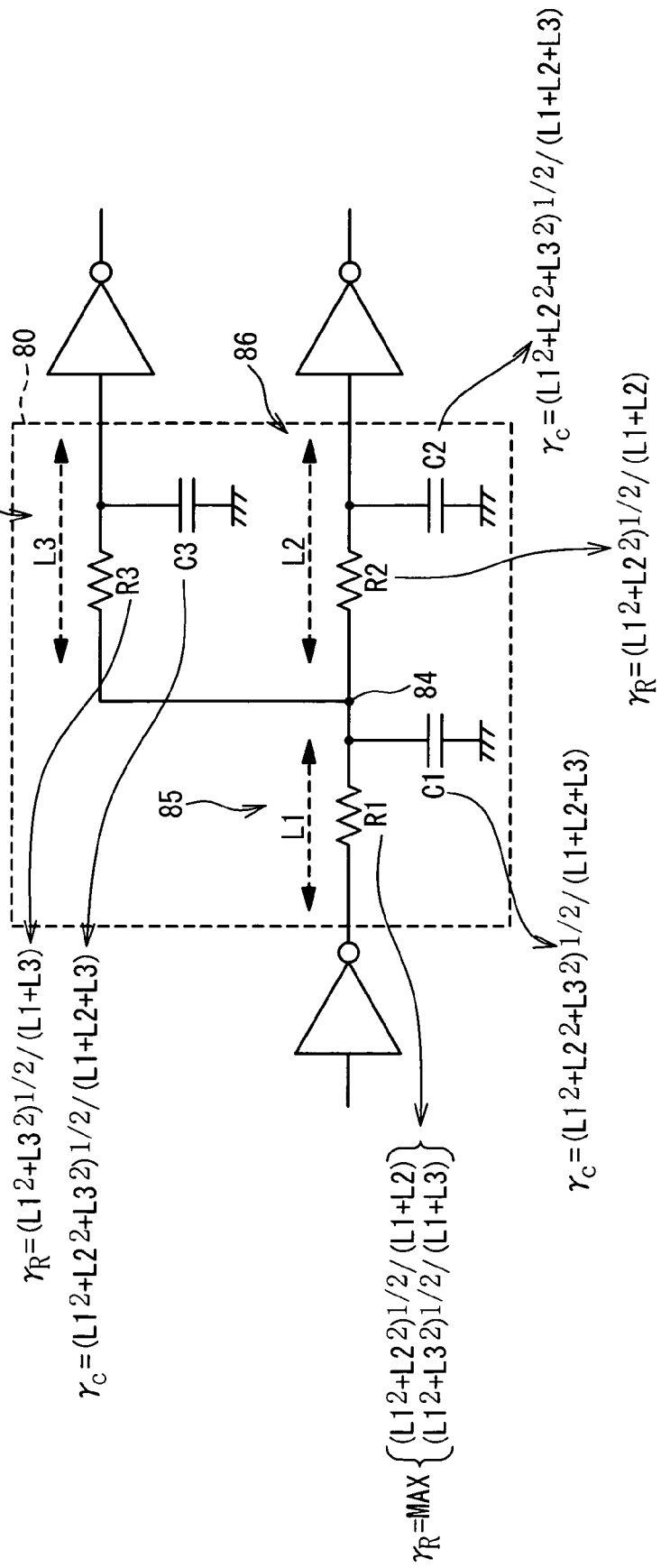
FIG. 18 is a conceptual diagram showing another example of the correction process in the second embodiment of the present invention.

FIG. 18 is a conceptual diagram showing another example of the correction process in this embodiment. In FIG. 18, a branching point is present in the node 80. More in detail, the node 80 includes interconnection elements 85 to 87. The interconnection elements 85 and 86 are connected in series through the connecting node 84. Also, the interconnection elements 85 and 87 are connected in series through the connecting node 84. The interconnection elements 86 and 87 are connected in parallel. Each length of the interconnection elements 85 to 87 is given as L1 to L3, respectively.

In this case, the correction parameter $\gamma_C$ for the parasitic capacitance is given by the same equation as the above equation (6) or (7). However, the correction parameter $\gamma_R$ for the parasitic resistance is different for each of the interconnection elements. More specifically, as for a line that includes the interconnection elements 85 and 86, the existence of the interconnection element 87 is ignored, and the correction parameter $\gamma_R$ is given as $\gamma_R(a)$ in the following equations (8). On the other hand, as for a line that includes the interconnection elements 85 and 87, the existence of the interconnection element 86 is ignored, and the correction parameter $\gamma_R$ is given as $\gamma_R(b)$ in the following equations (8).

$$\gamma_R(a) = \frac{\sqrt{L1^2 + L2^2}}{L1 + L2} \quad (8)$$

-continued $$\gamma_R(b) = \frac{\sqrt{L1^2 + L3^2}}{L1 + L3}$$

As for the interconnection elements 85 located on the upper-steam side from the connecting point 84, two kinds of correction parameters $\gamma_R(a)$ and $\gamma_R(b)$ are calculated as candidates. In this case, the larger one of the two correction parameters is adopted as the correction parameter $\gamma_R$ relevant to the interconnection element 85. Thus, when the connecting node is provided in the node 80, the correction parameter $\gamma_R$ is calculated separately for each of the lines connected in series. For example, when all the interconnection lengths L1 to L3 are equal in the example shown in FIG. 18, the correction parameter $\gamma_R$ for the parasitic resistance is 0.71, respectively.

More generally, it is assumed that the node 80 includes an interconnection group in each of N (N is a natural number) interconnection layers. In the node 80, a certain line is assumed to include a "sub interconnection group" connected in series in n (n is an integer number equal to or larger than 1, and equal to or smaller than N) interconnection layers. Also, it is assumed that a sum of the lengths of the interconnection elements in the interconnection group is given as Lj (j is an integer number equal to or larger than one, and equal to or smaller than n). At this time, the correction parameter $\gamma_R$ for the line is given by the following equation (9).

$$\gamma_R = \sqrt{\sum_{j}^{n} L_j^2} \bigg/ \sum_{j}^{n} L_j \quad (9)$$

Figure 19:
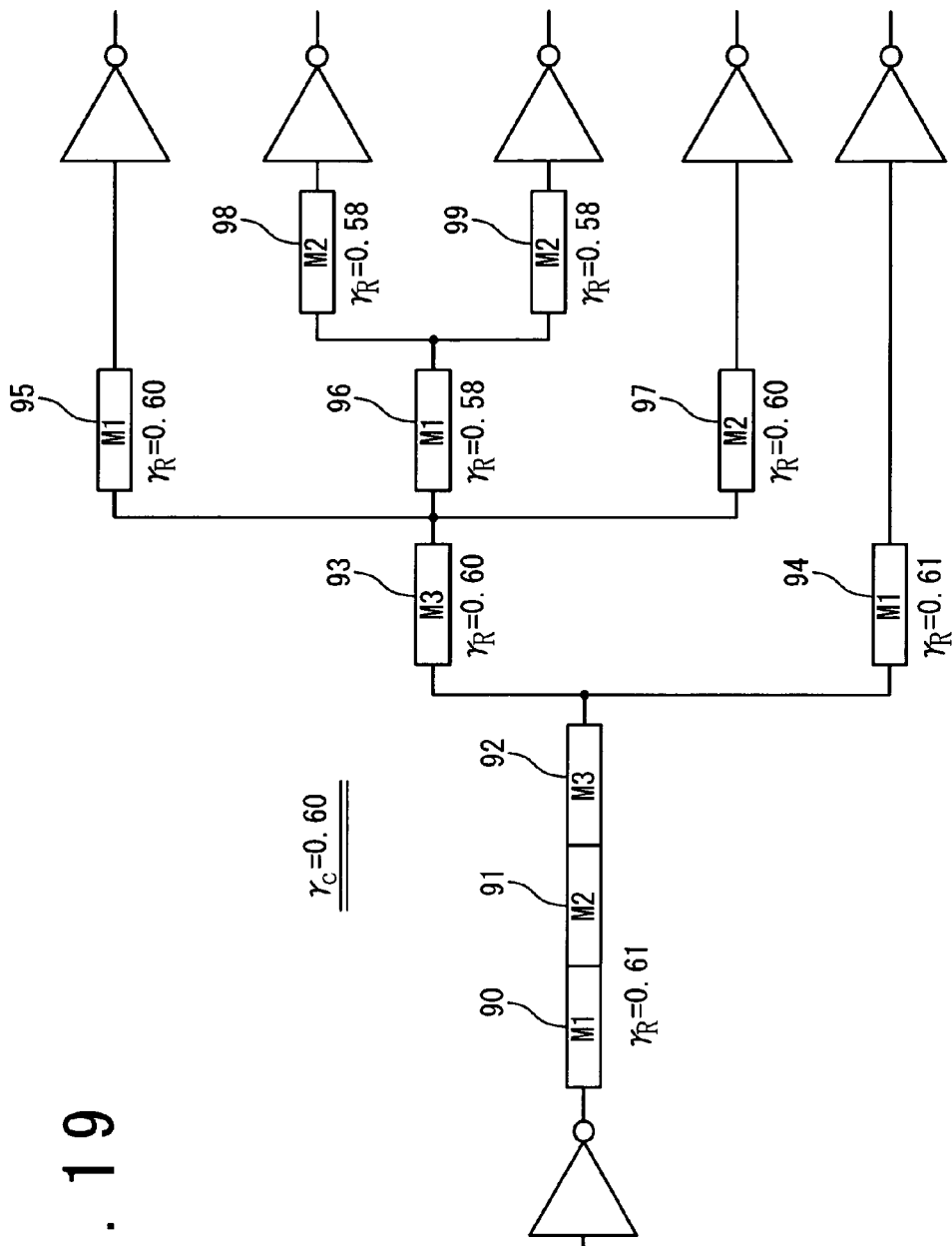
FIG. 19 is a conceptual diagram showing another example of the correction process in the second embodiment of the present invention.

FIG. 19 shows a structure of another node 80. This node 80 includes interconnection elements 90 to 99. The lengths of the interconnection elements 90 to 99 are all equal. In the node 80, the interconnection elements 90 and 94 to 96 are arranged in a first interconnection layer M1. The interconnection elements 91 and 97 to 99 are arranged in a second interconnection layer M2. The interconnection elements 92 and 93 are arranged in a third interconnection layer M3. Therefore, a ratio of the sum of the lengths of the interconnection elements in the interconnection group in each of the interconnection layers M1 to M3 is 2:2:1. Consequently, the correction parameter $\gamma_C$ for the parasitic capacitance is calculated to be 0.6 based on the above equation (6) or (7). Also, the correction parameter $\gamma_R$ for the parasitic resistance is calculated for each of the lines based on the above equation (9). When a plurality of correction parameters $\gamma_R$ are calculated for a certain interconnection element, the largest one of the plurality of correction parameters is selected. As a result, a distribution of the correction parameters $\gamma_R$ shown in FIG. 19 can be obtained.

Figure 20:
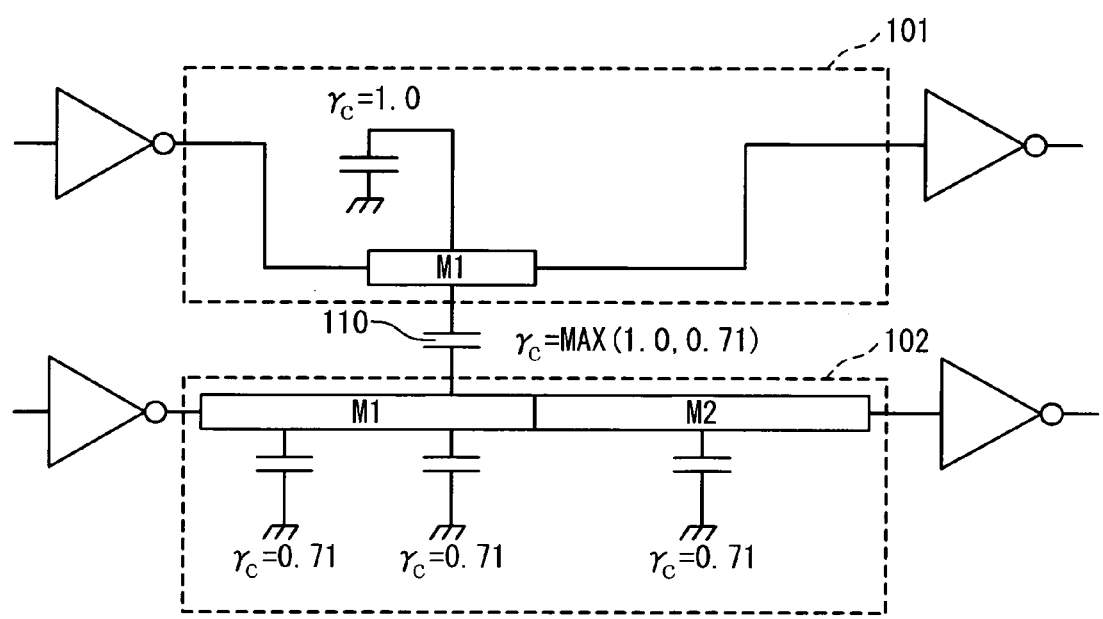
FIG. 20 is a conceptual diagram showing another example of the correction process in the second embodiment of the present invention.

FIG. 20 is a conceptual diagram showing another example of the correction process in this embodiment. In FIG. 20, a first node 101 includes an interconnection arranged in an interconnection layer M1, and a second node 102 includes the first interconnection arranged in the interconnection layer M1 and a second interconnection arranged in an interconnection layer M2. In the first node 101, the correction parameter $\gamma_C$ for the parasitic capacitance is calculated to be 1.00. In the second node 102, the correction parameter $\gamma_C$ for the parasitic capacitance is calculated to be 0.71. At this time, the larger correction parameter 1.00 is adopted for a coupling capacitance 110 between the first node 101 and the second node 102. That is, the largest among a plurality of correction parameters $\gamma_C$ calculated for each node, is adopted for a coupling capacitance between nodes.

By using the correction parameters $\gamma_R$ and $\gamma_C$ described above, the corner ratios $\beta_R$ and $\beta_C$ are corrected, and the correction ratios $\beta_R'$ and $\beta_C'$ are calculated (see the equation (5)). Then, by using the calculated correction ratios $\beta_R'$ and $\beta_C'$, the parasitic RC under the corner conditions is calculated (see FIG. 16 and the equation (4)). Thus, the LPE process in this embodiment is carried out.

According to the second embodiment, the same effect as that of the first embodiment can be attained. Further, according to the second embodiment, the "statistical relaxation" is further carried out for a corner ratio β. As a result, the fail rate in the delay verifying process is further reduced. Consequently, the TAT can be further reduced, and the design time of the semiconductor device can be further reduced.

According to the design technique of the semiconductor device of the present invention, the number of a plurality of conditions showing process variation is limited. In particular, the conditions that show the process variation are narrowed down to the four conditions which are necessary and sufficient. As a result, a time for one LPE process is reduced. That is to say, reduction in the design time of the semiconductor device is realized.

Further, according to the design technique of the semiconductor device of the present invention, a case that has statistically very low probability among the process variation is excluded in carrying out the LPE process. That is, the "statistical relaxation" is applied to the LPE process. Since it is not necessary to support unnecessary cases, the fail rate in the delay verifying process is reduced. The number of times to correct a layout and again perform the delay verifying process is greatly reduced, since the fail rate in the delay verifying process is reduced. That is, the TAT can be reduced, and the reduction in the design time of the semiconductor device can be realized.

Further, according to the manufacturing method of the semiconductor device of the present invention, it is possible to prevent an over margin of the design, since the method of the statistical relaxation is used, and variation of an interconnection delay time is estimated through exclusion of conditions that seem rare as actual manufacturing conditions. It is also possible to expect a high manufacturing yield and provide a high-quality semiconductor device, since variation of manufacturing conditions that seem possible in reality are take into consideration.

That is to say, when layout design of a semiconductor device is carried out, a design rule and manufacturing conditions (requirement specifications for a manufacturing process for satisfying the design rule) of the semiconductor device are usually determined in advance. The design rule includes minimum patterns of an interconnection width, interconnection space, and so on. Thus, it is determined in advance, to which extent of variation interconnection width, capacitance film thickness, layer resistance value, and dielectric constant should be manufactured. In carrying out the layout design of the semiconductor device, an interconnection pattern is determined based on the design rule such that functional specifications of the semiconductor device to be designed are realized. Generally, if the layout design of the semiconductor device is seemingly completed, manufacturing variation of the semiconductor device is considered, and variation of actual interconnection delay is estimated from the layout pattern. Then, a simulation is carried out to see whether or not the predetermined functions are realized. According to the present invention, it is possible to conduct the simulation under the consideration of actual manufacturing variation. Then, the pattern is formed on a semiconductor substrate to manufacture the semiconductor device in accordance with the verified layout pattern, by use of known methods. Consequently, it is possible to prevent an over margin of the layout design, and realize a space-saving layout, since variation of manufacturing conditions rare in reality are excluded. At the same, it is possible to expect a high manufacturing yield, and provide a high-quality semiconductor device, since the layout pattern takes variation of manufacturing conditions possible in reality, into consideration.

According to a semiconductor device design technique of the present invention, the number of a plurality of conditions showing process variation is limited. In particular, conditions showing the process variation are narrowed down to four conditions which are necessary and sufficient. Consequently, the time taken for one LPE process is reduced. That is, reduction in a design time of the semiconductor device is realized.

Further, according to the semiconductor device design technique of the present invention, the LPE is carried out with exclusion of a case that is statistically very low in probability among the process variation. That is to say, "statistical relaxation" is applied to the LPE. Since it is not necessary to support unnecessary cases, a fail rate in the delay verifying process is reduced. Because of the reduction in the fail rate in the delay verifying process, the number of times to correct the layout and again perform the delay verifying process is greatly reduced. In other words, TAT (Turn Around Time) is reduced, realizing a reduction in the design time of the semiconductor device.

What is claimed is:

1. A method of manufacturing a semiconductor device that comprises determining parasitic resistance and capacitance from a layout of an LSI, comprising:
   providing a plurality of patterns of a wiring structure which contains a target interconnection; and
   producing a library configured to store a first parameter indicating said parasitic resistance and a second parameter indicating said parasitic capacitance in relation to said target interconnection to each of said plurality of patterns,
   wherein:
   said producing comprises calculating said parasitic resistance and said parasitic capacitance in each of a plurality of conditions to each of said interconnections contained in said layout by referring to said parameters stored in said library;
   each of said parameters being defined within a predetermined range;
   said parameters do not take a border value at a same time in manufacture of said wiring structure for each of said plurality of patterns; and
   generating a netlist with parasitic RC by adding the calculated parasitic resistance and the calculated parasitic capacitance to said netlist.

2. A method of claim 1, wherein said plurality of conditions comprises a $0^{th}$ condition to a second condition,
   a desired width and desired film thickness of said target interconnection are $W_0$ and $T_0$, respectively, standard deviations of a distribution of said width of said target interconnection and a distribution of said film thickness thereof are $\sigma_W$ and $\sigma_T$, respectively, and said width W and said film thickness T in actual manufacture of said target interconnection are expressed, by using coefficients $\alpha_W$ and $\alpha_T$, as $W=W_0+\alpha_W{}^*\sigma_W$ and $T=T_0+\alpha_T{}^*\sigma_T$, said $0^{th}$ condition is a case where said width W and said film thickness T are $W_0$ and T0, respectively,
said first condition is a case where a delay in said target interconnection is maximized under a condition that $\alpha_W{}^2+\alpha_T{}^2$ is constant, and
said second condition is when the delay in said target interconnection is minimized under the condition that $\alpha_W{}^2+\alpha_T{}^2$ is constant.

3. A method of claim 2, wherein in case of said first condition, one of said parasitic resistance of and said parasitic capacitance related to said target interconnection is maximized, and the other is minimized, and
   in case of said second condition, said one is minimized and the other is maximized.

4. A method of claim 2, wherein said plurality of conditions further contains a third condition and a fourth condition,
   a deviation of another factor which relates to said delay is ranged from $+\sigma_0$ to $-\sigma_0$,
   said first condition is the case where said delay is maximized under the condition that the deviation of said another factor is one of $+\sigma_0$ and $-\sigma_0$ and $\alpha_W{}^2+\alpha_T{}^2$ is constant,
   said third condition is the case where said delay is maximized under the condition that the deviation of said another factor is the other of $+\sigma_0$ and $-\sigma_0$ and $\alpha_W{}^2+\alpha_T{}^2$ is constant,
   said second condition is the case where said delay is minimized under the condition that the deviation of said another factor is one of $+\sigma_0$ and $-\sigma_0$ and $\alpha_W{}^2+\alpha_T{}^2$ is constant, and
   said fourth condition is the case where said delay is minimized under the condition that the deviation of said another factor is the other of $+\sigma_0$ and $-\sigma_0$ and $\alpha_W{}^2+\alpha_T{}^2$ is constant.

5. A method of claim 4, wherein said coefficients $\alpha_W$ and $\alpha_T$ in said first condition are equal to said coefficients $\alpha_W$ and $\alpha_T$ in said third condition, and
   said coefficients $\alpha_W$ and $\alpha_T$ in said second condition are equal to said coefficients $\alpha_W$ and $\alpha_T$ in said fourth condition.

6. A method of claim 4, wherein in said library, a center resistance value as a value of said parasitic resistance and a center capacitance value as a value of said parasitic capacitance are stored as said parameter to said $0^{th}$ condition, and
   a ratio $\beta_R$ of said parasitic resistance to said center resistance and a ratio $\beta_C$ of said parasitic capacitance to said center capacitance value are stored as said parameter to each of said first to fourth conditions.

7. A method of claim 6, further comprises:
reading a netlist of said LSI;
reading a layout data indicating said layout of said LSI;
calculating said parasitic resistance and said parasitic capacitance in each of said plurality of conditions to each of said interconnections contained in said layout by referring to said center resistance value, said center capacitance value, and the ratios $\beta_R$ and $\beta_C$ stored in said library; and
generating a netlist with parasitic RC by adding the calculated parasitic resistance and the calculated parasitic capacitance to said netlist.

8. A method of claim 7, wherein said calculating comprises:
calculating said parasitic resistance and said parasitic capacitance in each of said first to fourth conditions by multiplying the ratios $\beta_R$ and $\beta_C$ by said center resistance value and said center capacitance value, respectively.

9. A method of claim 7, wherein said calculating comprises:
generating correction ratios $\beta_R'$ and $\beta_C'$ by correcting said ratios $\beta_R$ and $\beta_C$ based on a configuration of a node; and
calculating said parasitic resistance and said parasitic capacitance in each of said first to fourth conditions by multiplying the correction ratios $\beta_R'$ and $\beta_C'$ by said center resistance value and said center capacitance value, respectively.

10. A method of claim 9, wherein said node comprises a group of interconnections in each of N interconnection layers (N is a natural number),
a summation of lengths of the interconnections in said group is Li (i is an integer equal to or more than 1 and equal to or smaller than N),
said ratio $\beta_C$ and said correction ratio $\beta_C'$ are the following equation:

$$\beta_C'=1+(\beta_C-1)\gamma_C$$

a parameter $\gamma_C$ satisfies the following equation:

$$\gamma_C = \sqrt{\sum_{i}^{N} L_i^2} \Big/ \sum_{i}^{N} L_i$$

11. A method of claim 10, wherein said interconnection groups are connected in series in said node,
said ratio $\beta_R$ and said correction ratio $\beta_R'$ are the following equation:

$$\beta_R'=1+(\beta_R-1)\gamma_R$$

said parameter $\gamma_R$ satisfies the following equation:

$$\gamma_R = \sqrt{\sum_{i}^{N} L_i^2} \Big/ \sum_{i}^{N} L_i$$

12. A method of claim 10, wherein said interconnection groups is branched in said node,
a sub interconnection group in n interconnection layer (n is an integer equal to or more than 1 and equal to or smaller than N) is connected in series to one interconnection in said interconnection group,
a summation of lengths of the interconnections in said sub interconnection group is $L_j$ (j is an integer equal to or more than 1 and equal to or smaller than n),
said ratio $\beta_R$ and said correction ratio $\beta_R'$ to said one interconnection are the following equation:

$$\beta_R'=1+(\beta_R-1)\gamma_R$$

said parameter $\gamma_R$ satisfies the following equation:

$$\gamma_R = \sqrt{\sum_{j}^{n} L_j^2} \Big/ \sum_{j}^{n} L_j$$

13. A method of claim 12, wherein when a plurality of said correction ratios $\beta_R'$ are calculated to said one interconnection, the largest one of said plurality of correction ratios $\beta_R'$ is adopted.

14. A method of claim 10, wherein the largest one of a plurality of said correction ratios $\beta_C'$ is adopted as a coupling capacitance between said nodes.

15. A method of claim 1, further comprises:
reading a netlist of said LSI;
reading a layout data indicating said layout of said LSI;
calculating said parasitic resistance and said parasitic capacitance in each of said plurality of conditions to each of said interconnections contained in said layout by referring to said parameters stored in said library; and
generating a netlist with parasitic RC by adding the calculated parasitic resistance and the calculated parasitic capacitance to said netlist.

16. A method of manufacturing a semiconductor device that comprises determining parasitic resistance and capacitance from a layout of an LSI, by referring a library, wherein a wiring structure which contains a target interconnection is a pattern, and said library stores parameters indicating said parasitic resistance and said parasitic capacitance in relation to said target interconnection to a plurality of conditions for variation in manufacture of said wiring structure with respect to each of a plurality of said patterns, comprising:
reading a netlist of said LSI;
reading a layout data indicating said layout of said LSI;
calculating said parasitic resistance and said parasitic capacitance in each of said plurality of conditions to each of said interconnections contained in said layout by referring to said parameters stored in said library; and
generating a netlist with parasitic RC by adding the calculated parasitic resistance and the calculated parasitic capacitance to said netlist.

17. A method of claim 16, wherein a desired width and desired film thickness of said target interconnection are $W_0$ and $T_0$, respectively, standard deviations of a distribution of said width of said target interconnection and a distribution of said film thickness thereof are $\sigma_W$ and $\sigma_T$, respectively, and said width W and said film thickness T in actual manufacture of said target interconnection are expressed, by using coefficients $\alpha_W$ and $\alpha_T$, as $$W=W_0+\alpha_W*\sigma_W$$

and $$T=T_0+\alpha_T*\sigma_T,$$

said plurality of conditions comprises a $0^{th}$ condition to a second condition,
said $0^{th}$ condition is a case where said width W and said film thickness T are $W_0$ and T0, respectively,
said first condition is a case where a delay in said target interconnection is maximized under a condition that $\alpha_W^2+\alpha_T^2$ is constant, and
said second condition is when the delay in said target interconnection is minimized under the condition that $\alpha_W^2+\alpha_T^2$ is constant.

18. A method of claim 17, wherein said plurality of conditions further contains a third condition and a fourth condition,
a deviation of another factor which relates to said delay is ranged from $+\sigma_0$ to $-\sigma_0$,
said first condition is the case where said delay is maximized under the condition that the deviation of said another factor is one of $+\sigma_0$ and $-\sigma_0$ and $\alpha_W^2+\alpha_T^2$ is constant,
said third condition is the case where said delay is maximized under the condition that the deviation of said another factor is the other of $+\sigma_0$ and $-\sigma_0$ and $\alpha_W^2+\alpha_T^2$ is constant,
said second condition is the case where said delay is minimized under the condition that the deviation of said another factor is one of $+\sigma_0$ and $-\sigma_0$ and $\alpha_W^2+\alpha_T^2$ is constant, and said fourth condition is the case where said delay is minimized under the condition that the deviation of said another factor is the other of $+\sigma_0$ and $-\sigma_0$ and $\alpha_W^2+\alpha_T^2$ is constant.

19. A method of claim 18, wherein in said library, a center resistance value as a value of said parasitic resistance and a center capacitance value as a value of said parasitic capacitance are stored as said parameter to said 0th condition, and a ratio $\beta_R$ of said parasitic resistance to said center resistance and a ratio $\beta_C$ of said parasitic capacitance to said center capacitance value are stored as said parameter to each of said first to fourth conditions.

* * * * *